(12) United States Patent
Dorobantu et al.

(10) Patent No.: US 10,234,769 B2
(45) Date of Patent: Mar. 19, 2019

(54) MONITORING SYSTEM FOR AN OPTICAL LITHOGRAPHY SYSTEM

(71) Applicant: Cymer, LLC, San Diego, CA (US)

(72) Inventors: Andrei Dorobantu, San Diego, CA (US); Joshua Jon Thornes, San Diego, CA (US); Kevin M. O'Brien, San Diego, CA (US); Matthew Ryan Graham, San Diego, CA (US)

(73) Assignee: Cymer, LLC, San Diego, CA (US)

( * ) Notice: Subject to any disclaimer, the term of this patent is extended or adjusted under 35 U.S.C. 154(b) by 0 days.

(21) Appl. No.: 15/602,028

(22) Filed: May 22, 2017

(65) Prior Publication Data

US 2018/0335701 A1    Nov. 22, 2018

(51) Int. Cl.
*G03B 27/42* (2006.01)
*G03F 7/20* (2006.01)

(52) U.S. Cl.
CPC .................. *G03F 7/7055* (2013.01)

(58) Field of Classification Search
CPC ............. G03F 7/70558; G03F 7/70358; G03F 7/70041; G03F 7/20; G03F 7/70516;
(Continued)

(56) References Cited

U.S. PATENT DOCUMENTS

| 2003/0090643 | A1  | 5/2003 | Sato |  |
|---|---|---|---|---|
| 2003/0098959 | A1* | 5/2003 | Hagiwara | G03F 7/70041 355/69 |

(Continued)

FOREIGN PATENT DOCUMENTS

| KR | 20130042766 A | 4/2013 |
|---|---|---|
| TW | 201626114 A | 7/2016 |

(Continued)

OTHER PUBLICATIONS

Yongsheng et al., "Remote Monitoring and Control System of Solar Street Lamps Based on ZigBee Wireless Sensor Network ad GPRS," Institute of Micro/Nano Devices and Solar Cells, School of Physics & Information Engineering, Fuzhou University, Fuzhou, China, W. Hu (Ed.): Electronics and Signal Processing, LNEE 97, pp. 959-967 (9 total pages).

(Continued)

*Primary Examiner* — Mesfin T Asfaw
(74) *Attorney, Agent, or Firm* — DiBerardino McGovern IP Group LLC

(57) ABSTRACT

An optical lithography system is monitored. Information is received from the optical lithography system; a rule is accessed, the rule being associated with one or more of an event in the optical lithography system and an amount of time; a module stored in a library of modules is identified based on the accessed rule; whether a particular condition exists in the optical lithography system is determined using the identified module and the information received from the optical lithography system; and if the particular condition exists, a command signal is generated based on one or more characteristics of the particular condition and provided to an optical source of the optical lithography system. The command signal is based on the determined particular condition, and the command signal is sufficient to change one or more operating parameters of the optical source.

30 Claims, 9 Drawing Sheets

(58) Field of Classification Search
CPC ............... G03F 7/70858; G03F 7/7055; G03F 7/70133; G03F 7/70725; G03F 7/70033; G03F 7/2002; G03F 7/2037; G03F 7/70025; G03F 7/7005; G03F 2007/2067
See application file for complete search history.

(56) References Cited

U.S. PATENT DOCUMENTS

| | | |
|---|---|---|
| 2008/0035666 A1 | 2/2008 | Porras et al. |
| 2008/0073572 A1 | 3/2008 | Schwarzl et al. |
| 2008/0077352 A1 | 3/2008 | Willis et al. |
| 2012/0327383 A1 | 12/2012 | Cao et al. |
| 2014/0028219 A1 | 1/2014 | Chen et al. |
| 2014/0084797 A1 | 3/2014 | Chakravarty et al. |
| 2014/0104614 A1 | 4/2014 | Rokitski et al. |
| 2015/0070673 A1 | 3/2015 | Lalovic et al. |
| 2016/0161859 A1 | 6/2016 | Ahlawat |
| 2016/0299441 A1 | 10/2016 | Ahlawat |
| 2017/0221741 A1* | 8/2017 | Buhl ...................... H01L 22/26 |

FOREIGN PATENT DOCUMENTS

| | | |
|---|---|---|
| TW | 201714023 A | 4/2017 |
| WO | 2017050506 A1 | 3/2017 |

OTHER PUBLICATIONS

Blaine R. Copenheaver, U.S. International Searching Authority, International Search Report and Written Opinion, counterpart PCT Application No. PCT/US2018/025751, dated Jun. 22, 2018, 12 pages total.

Office Action, counterpart Taiwanese Patent Application No. 107114373, dated Nov. 29, 2018, 8 pages total (including English translation of 4 pages).

* cited by examiner

MONITORING SYSTEM FOR AN OPTICAL LITHOGRAPHY SYSTEM

TECHNICAL FIELD

This disclosure relates to a monitoring system for an optical lithography system.

BACKGROUND

Photolithography is the process by which semiconductor circuitry is patterned on a substrate such as a silicon wafer. An optical source generates deep ultraviolet (DUV) light used to expose a photoresist on the wafer. DUV light may include wavelengths from, for example, about 100 nanometers (nm) to about 400 nm. Often, the optical source is a laser source (for example, an excimer laser) and the DUV light is a pulsed laser beam. The DUV light from the optical source interacts with a projection optical system, which projects the beam through a mask onto the photoresist on the silicon wafer. In this way, a layer of chip design is patterned onto the photoresist. The photoresist and wafer are subsequently etched and cleaned, and then the photolithography process repeats.

SUMMARY

In one general aspect, a system includes an optical lithography system and a monitoring system. The optical lithography system includes an optical source and a lithography apparatus. The optical source is configured to produce an optical beam, and the optical source includes one or more control systems, each of the one or more control systems being configured to adjust an operating parameter of the optical source. The lithography apparatus includes: a projection optical system configured to receive the optical beam from the optical source and to produce an exposure beam, and a wafer region configured to receive a wafer and the exposure beam. The monitoring system is coupled to the optical lithography system, and the monitoring system is configured to access at least one rule, identify a module from a library of modules based on the accessed rule, determine whether a particular condition exists in the optical lithography system using the identified module and information from the optical lithography system, and if the particular condition exists, provide a command signal to the optical lithography system, the command signal being based on the determined particular condition and being sufficient to cause one or more of the control systems to adjust one or more operating parameters of the optical source. Each of the one or more operating parameters of the optical source specifies a behavior of the optical source, and adjusting one or more operating parameters of the optical source changes one or more behaviors of the optical source.

Implementations may include one or more of the following features. The optical source also may include a data interface, the monitoring system may be coupled to the data interface of the optical source, the information from the optical lithography system may be received from the data interface of the optical source, and the command signal may be provided to the optical lithography system through the data interface of the optical source.

The optical source also may include a data interface, the lithography apparatus also may include a data interface, the monitoring system may be coupled to the data interface of the optical source and to the data interface of the lithography apparatus, the information from the optical lithography system may come from one or more of the optical source and the lithography apparatus, and the command signal may be provided to the optical lithography system through the data interface of the optical source.

The optical beam produced by the optical source may be a pulsed optical beam that has a repetition rate, the repetition rate indicating a time between a particular pulse of the pulsed optical beam and a pulse immediately adjacent to the particular pulse, the one or more control systems of the optical source may be configured to operate at a control rate, the control rate being equal to or greater than the repetition rate such that the control systems are capable of adjusting the one or more operating parameters of the optical source for each pulse in the pulsed optical beam, and the monitoring system may have a monitoring system rate, the monitoring system rate indicating a minimum amount of time between two separate instances of the command signal being provided to the optical lithography system, and the minimum amount of time between two separate instances of the command signal being provided to the optical lithography system is greater than the time between pulses of the pulsed optical beam such that the monitoring system rate is slower than the control rate and the repetition rate. In some implementations, the monitoring system is further configured to: store information received from the optical lithography system over a first time period, the first time period being greater than the time between two adjacent pulses in the pulsed optical beam; analyze the stored information received from the optical lithography system over the first time period, where the monitoring system is configured to determine whether the particular condition exists using the identified module and the analyzed stored information. The monitoring system may be further configured to poll the optical lithography system to receive the information from the optical lithography system.

In some implementations, the monitoring system is coupled to one or more other optical lithography systems, and the monitoring system is configured to: receive information from any coupled optical lithography system, and provide command signals to any coupled optical lithography system. The monitoring system may determine that the particular condition exists in at least one of the other optical lithography systems based on the received information, the monitoring system may identify in which of the optical lithography systems the condition exists, and the monitoring system may provide the command signal only to the identified lithography systems. In these implementations, when the monitoring system determines that the particular condition exists in at least one of the other optical lithography systems based on the received information, the monitoring system may identify in which of the optical lithography systems the condition exists, and the monitoring system may provide the command signal to all of the optical lithography systems.

The operating parameters of the optical source may have default values, and the command signal causes at least one of the one or more control systems to adjust at least one operating parameter to a value that is different than the default value of that operating parameter.

The at least one rule may include a collection of rules, the collection of rules including event-based rules and time-based rules, the event-based rules being rules that are associated with an event in the optical source and that specify one or more modules in the library of modules based on an occurrence of the event in the optical source, and the time-based rules being rules that are associated with an amount of time and that specify one or more modules in the library of modules based on the passage of the amount of time. The monitoring system may be further configured to: determine whether an event has occurred within the optical source, determine whether an amount of time has passed, and access one of the rules of the collection of rules based on one or more of the determination of whether an event has occurred within the optical source and the determination of whether an amount of time has passed.

The command signal may be provided to the optical lithography system while the optical source produces the optical beam, and the one or more operating parameters may be adjusted while the optical source produces the optical beam.

In another general aspect, an optical lithography system is monitored. Information is received from the optical lithography system during a first time period; a rule is accessed, the rule being associated with one or more of an event in the optical lithography system and an amount of time passing; a module stored in a library of modules is identified based on the accessed rule; whether a particular condition exists in the optical lithography system is determined using the identified module and the information received from the optical lithography system during the first time period; and if the particular condition exists, a command signal is generated based on one or more characteristics of the particular condition and provided to an optical source of the optical lithography system. The command signal is based on the determined particular condition, the command signal is sufficient to change one or more operating parameters of the optical source, and the command signal is provided to the optical source after the first time period.

The information received during the first time period may be stored, and determining whether a particular condition exists in the optical lithography system may include analyzing the stored information after the first time period. In some implementations, a rule to access may be determined based on the received information from the optical lithography system.

Determining whether a particular condition exists may include: comparing the information received from the optical lithography system during the first time period to stored information, determining whether a threshold is met or exceeded based on the comparison, and declaring that the particular condition exists when the threshold is met or exceeded.

Determining whether a particular condition exists may include: analyzing the information received from the optical lithography system during the first time period, determining a value of one or more operating parameters of the optical source based on the analyzed information, comparing the determined values to an expected value for each of the one or more operating parameters, and declaring that the particular condition exists when the determined values are outside of a pre-defined range of values relative to the expected value.

In some implementations, an indication of an adjustment to one or more operating parameters of the optical source may be presented, the adjustment being caused by the control signal, and the indication may be perceivable to an operator of the optical lithography system.

In another general aspect, a monitoring system includes a monitoring data interface configured to send information to and receive information from one or more optical lithography systems, each of the optical lithography systems comprising an optical source; an electronic storage; and one or more electronic processors coupled to the electronic storage, the electronic storage including instructions that, when executed, cause the one or more processors to: access at least one rule, the rule associating one or more of an event in any of the one or more optical lithography systems and a temporal period with a module configured to analyze information from any of the one or more optical lithography systems and produce a command signal; identify a module in a library of modules stored at the electronic storage based on the accessed at least one rule; determine whether a particular condition exists in any of the one or more of the optical lithography systems using the identified module and information from the optical lithography system; and if the particular condition exists in any of the one or more optical lithography systems: generate a command signal, the command signal being based on the determined particular condition and being sufficient to change one or more operating parameters of an optical source of any of the one or more of the optical lithography systems, and provide the command signal to at least one optical source.

The command signal may be provided to the at least one optical source while the at least one optical source produces a pulsed optical beam.

The at least one rule and one or more of the modules in the library of modules may be configured to be edited by an operator of the monitoring system. The at least one rule may include one or more of event-based rules and time-based rules, the event-based rules being associated with an occurrence of an event in the optical lithography system, and the time-based rules being associated with a passage of an amount of time.

Implementations of any of the techniques described above and herein may include a process, an apparatus, a control system, instructions stored on a non-transient machine-readable computer medium, and/or a method. The details of one or more implementations are set forth in the accompanying drawings and the description below. Other features will be apparent from the description and drawings, and from the claims.

DETAILED DESCRIPTION

Figure 1:
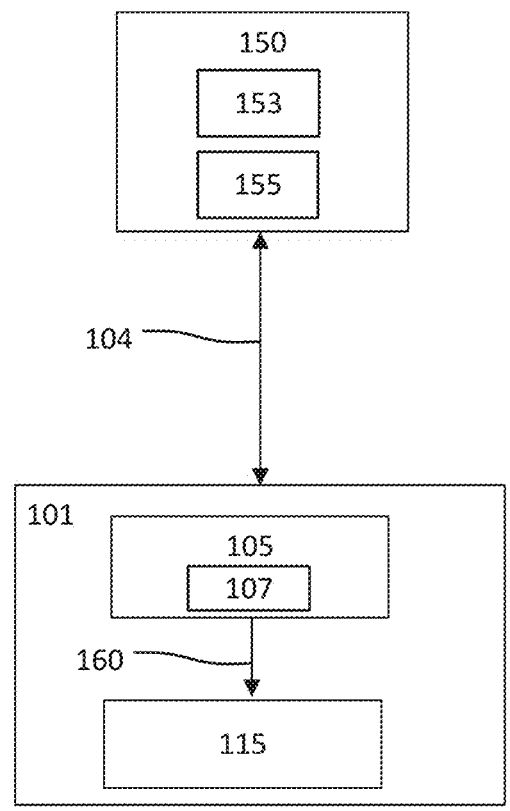
FIG. 1 is a block diagram of an example of a monitoring system coupled to an optical lithography system.

A monitoring system for an optical lithography system (or photolithography system) is disclosed. Referring to FIG. 1, a block diagram of a system 100 is shown. The system 100 includes an example of a monitoring system. In the example of FIG. 1, a monitoring system 150 is in communication with an optical lithography system 101 via a data connection 104. The optical lithography system includes an optical source 105, which provides an optical beam 160 to a lithography apparatus 115 to expose wafers. The lithography apparatus 115 also may be referred to as a scanner. The monitoring system 150 may be co-located with the optical lithography system 101. For example, the monitoring system 150 and the optical lithography system 101 may be in the same plant or location (for example, a wafer fabrication facility), or the monitoring system 150 and the optical lithography system 101 may be in different buildings but within the same campus or customer site and behind the same electronic firewall.

As discussed in greater detail below, the monitoring system 150 provides a framework for performance monitoring, fault detection, performance optimization, and performance recovery for the optical source 105 and/or the optical lithography system 101. The monitoring system 150 monitors the optical lithography system 101 to assess a condition of the optical source 105 and/or the optical lithography system 101. A condition is any property of the optical source 105 or the optical lithography system 101 that relates to the performance of the optical source 105 and/or the optical lithography system 101. When particular conditions are determined to be present, the monitoring system 150 issues a command signal to the optical source 105 to change or adjust one or more operating parameters of the optical source 105. An operating parameter of the optical source 105 is any quantity or setting that specifies or governs a behavior of the optical source 105. Adjusting one or more of the operating parameters causes a corresponding change in one or more associated behaviors of the optical source 105. Because the optical source 105 provides the optical beam 160 to the lithography apparatus 115, changing the behavior of the optical source 105 also may change the overall performance of the optical lithography system 101.

The monitoring system 150 is also able to place the optical source 105 into various operating modes and monitor the performance of the optical lithography system 101. For example, the monitoring system 150 may place the optical source 105 in a limited operation mode. The limited operation mode provides limited functionality and may be used instead of taking the optical lithography system 101 completely out of service. In the limited operation mode, the performance of the optical source 105 and/or the optical lithography system 101 may be intentionally degraded or made sub-optimal in response to a particular condition. In this case, the limited operation mode allows the optical source 105 to still produce the optical beam 160 and expose wafers in a limited way, but avoids taking the optical lithography system 101 completely out of service.

The monitoring system 150 is also able to place the optical source 105 in a diagnostic mode or a recovery mode. The diagnostic mode allows the optical source 105 to perform automated and non-manual testing activities. In the recovery mode, the monitoring system 150 may cause the optical source 105 to take an action that causes the optical source 105 to return to a nominal or optimized performance state. The diagnostic mode and the recovery modes are distinct from the limited operation mode in that the lithography apparatus 115 is not exposing wafers in these modes.

The monitoring system 150 monitors the optical source 105 and/or the optical lithography system 101 without interfering with the operation of the optical source 105 and without requiring operator intervention. The monitoring system 150 also may monitor the performance of the optical source 105 and/or the optical lithography system 101, and may change the behavior of the optical source 105, while the optical source 105 is in operation and produces the optical beam 160. For example, the monitoring system 150 may adjust one or more operating parameters of the optical source 105 while the optical source 105 produces the optical beam 160 and the lithography apparatus 115 exposes a wafer or wafers.

In another example, the monitoring system 150 may monitor the performance of the optical lithography system 101 and/or the optical source 105 after placing the optical source 105 into the limited performance mode, the recovery mode, or the diagnostic mode. When operating in the diagnostic mode or the recovery mode, the monitoring system 150 may monitor the performance of the optical source 105 and/or the optical lithography system 101 while the source 105 is in operation but is not exposing wafers. When operating in the limited operation mode, the monitoring system 150 may monitor the performance of the optical lithography system 101 and/or the optical source 105 while the optical lithography system 101 exposes wafers.

Figure 4:
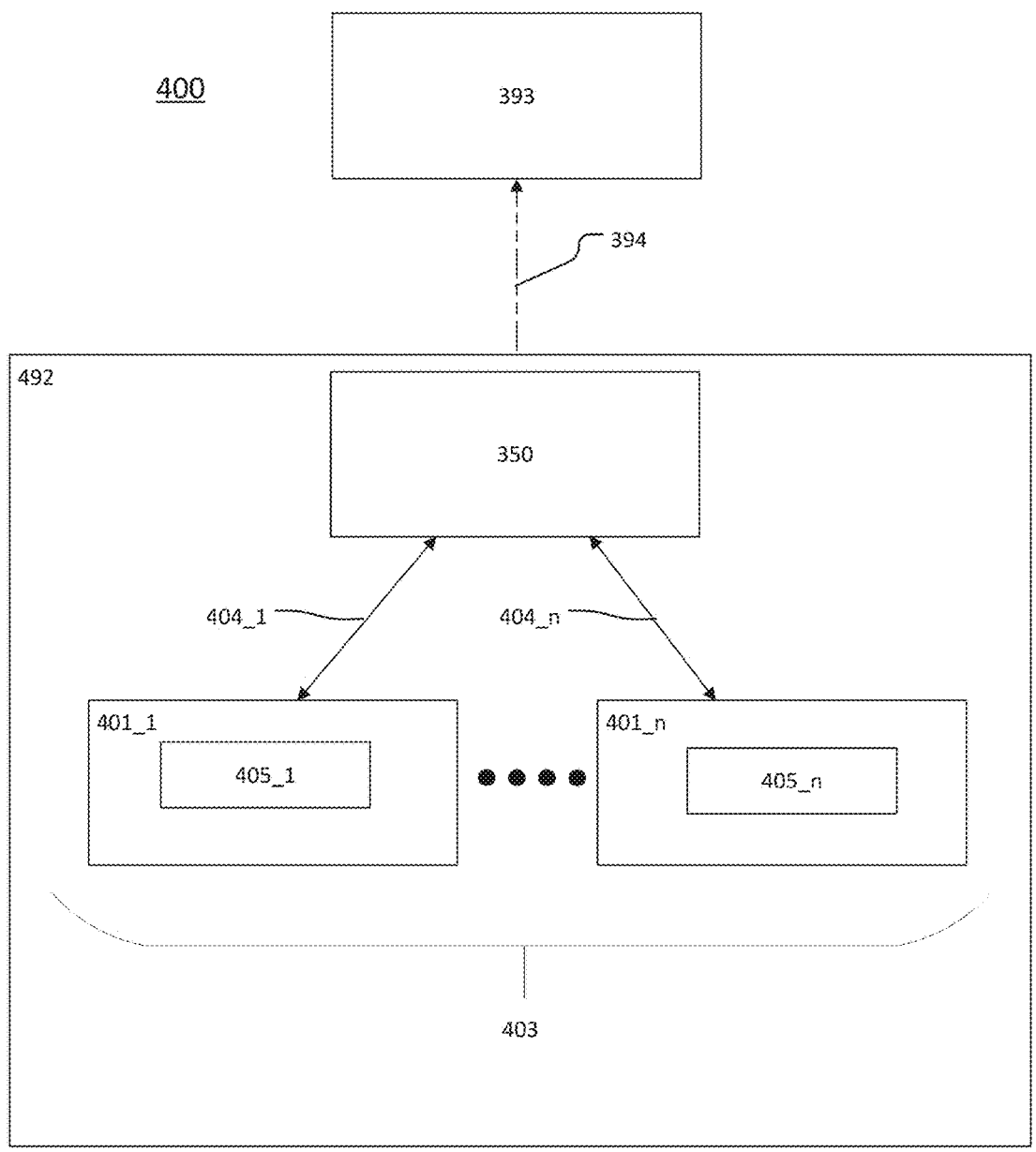
FIG. 4 is a block diagram of a system that includes the monitoring system of FIG. 3 coupled to a group of optical lithography systems.
Figure 9:
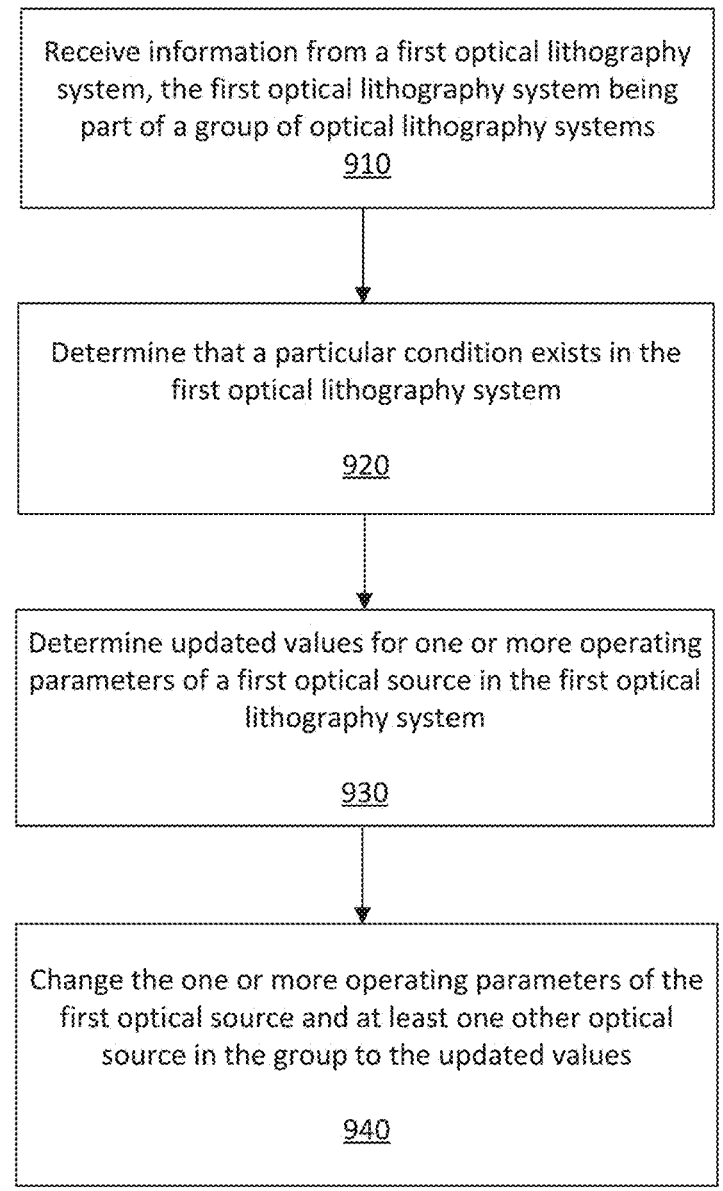

As discussed further with respect to FIGS. 4 and 9, the monitoring system 150 is also capable of monitoring a group of optical lithography systems and/or optical sources and using performance trends determined from one of the optical lithography systems and/or optical sources of the group to improve the performance of the other members of the group. The group of optical sources and/or optical lithography systems may be located in the same plant (for example, a wafer fabrication facility or factory), owned by the same corporate entity and located in the same plant or in different plants but behind the same electronic firewall, or may be used for the same specific application regardless of co-location or ownership.

Referring again to FIG. 1, the optical source 105 includes a control system 107 that controls low-level operations of the optical source 105 by adjusting certain of the operating parameters of the optical source 105. The control system 107 may be, for example, a feedback or feed-forward controller implemented on an embedded processor. The control system 107 operates on a particular subsystem of the optical source 105. The optical source 105 may include many subsystems, each of which may include, for example, controllable physical devices, a system that is implemented in software, or a system that includes hardware and software aspects. The control system 107 may control, for example, a repetition rate of a pulsed optical beam emitted by the source 105, a position of various optical elements within the optical source 105, or temperature and/or pressure of a gaseous gain medium in an optical chamber of the optical source 105.

The monitoring system 150 is implemented as a system that is distinct from the control system 107. Implementing the monitoring system 150 separately from the control system 107 allows the monitoring system 150 to monitor and analyze the overall performance of the optical lithography system 101 and/or the optical source 105. The optical source 105 may include many instances of the control system 107, each of which controls one or more subsystems. The monitoring system 150 may analyze information related to all of the subsystems and all of the instances of the control system 107. Thus, the monitoring system 150 is able to analyze the overall performance of the optical source 105 and is not limited to monitoring the performance of a particular subsystem. Implementing the monitoring system 150 separately from the control system 107 also allows the monitoring system 150 to monitor the optical source 105 without interfering with the operation of the optical source 105.

The control system 107 may operate on a relatively short time frame, for example, on each pulse of a pulsed optical beam emitted by the optical source 105. The monitoring system 150 may monitor the optical lithography system 101 and/or the optical source 105 over a longer period of time than the control system 107, and the monitoring system 150 also may take corrective action based on the long-term performance of the optical source 105. For example, the monitoring system 150 may take corrective action based on the performance of the optical lithography system 101 and/or the optical source 105 over a period of days, weeks, or months.

Furthermore, the monitoring system 150 has capabilities that the control system 107 does not have. The monitoring system 150 is implemented on a general-purpose computer instead of an embedded processor. An embedded processor is typically smaller than a general-purpose computer and uses less power. A general-purpose computer is capable of performing more complex calculations and storing a larger amount of data than an embedded processor. Thus, the monitoring system 150 is able to store a larger amount of data from the optical source 105 and analyze that data in more sophisticated ways than are possible with an embedded processor (such as an embedded processor used to implement the control system 107).

Additionally, because the monitoring system 150 monitors the performance of the optical source 105 on an ongoing (for example, constant, periodic, on-demand, or regular) basis, the monitoring system 150 may identify and correct potential performance problems at an early stage when correction is simpler, faster, and/or feasible at all. For example, the monitoring system 150 may be used to identify and correct potential problems prior to those problems escalating to a point of requiring manual intervention by an operator or a specialist. Such manual intervention typically involves removing the optical source 105 from service (for example, the optical source 105 and the optical lithography system 101 are unable to expose wafers when the optical source 105 is removed from service). As such, use of the monitoring system 150 may reduce or eliminate the need for time-consuming and costly manual troubleshooting and repair of the optical source 105.

Figure 3:
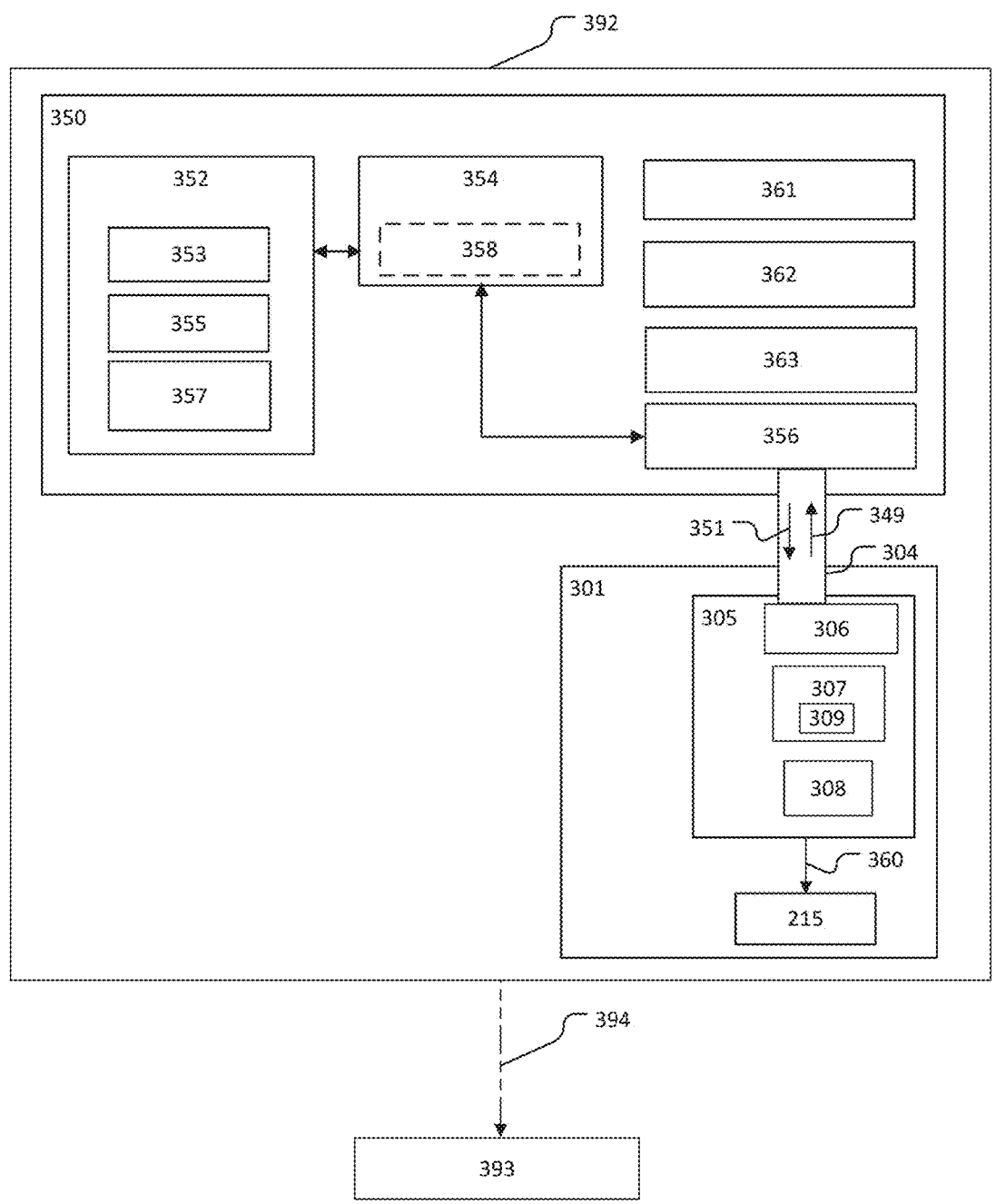
FIG. 3 is a block diagram of an example of an implementation of the monitoring system of FIG. 1.
Figure 7:
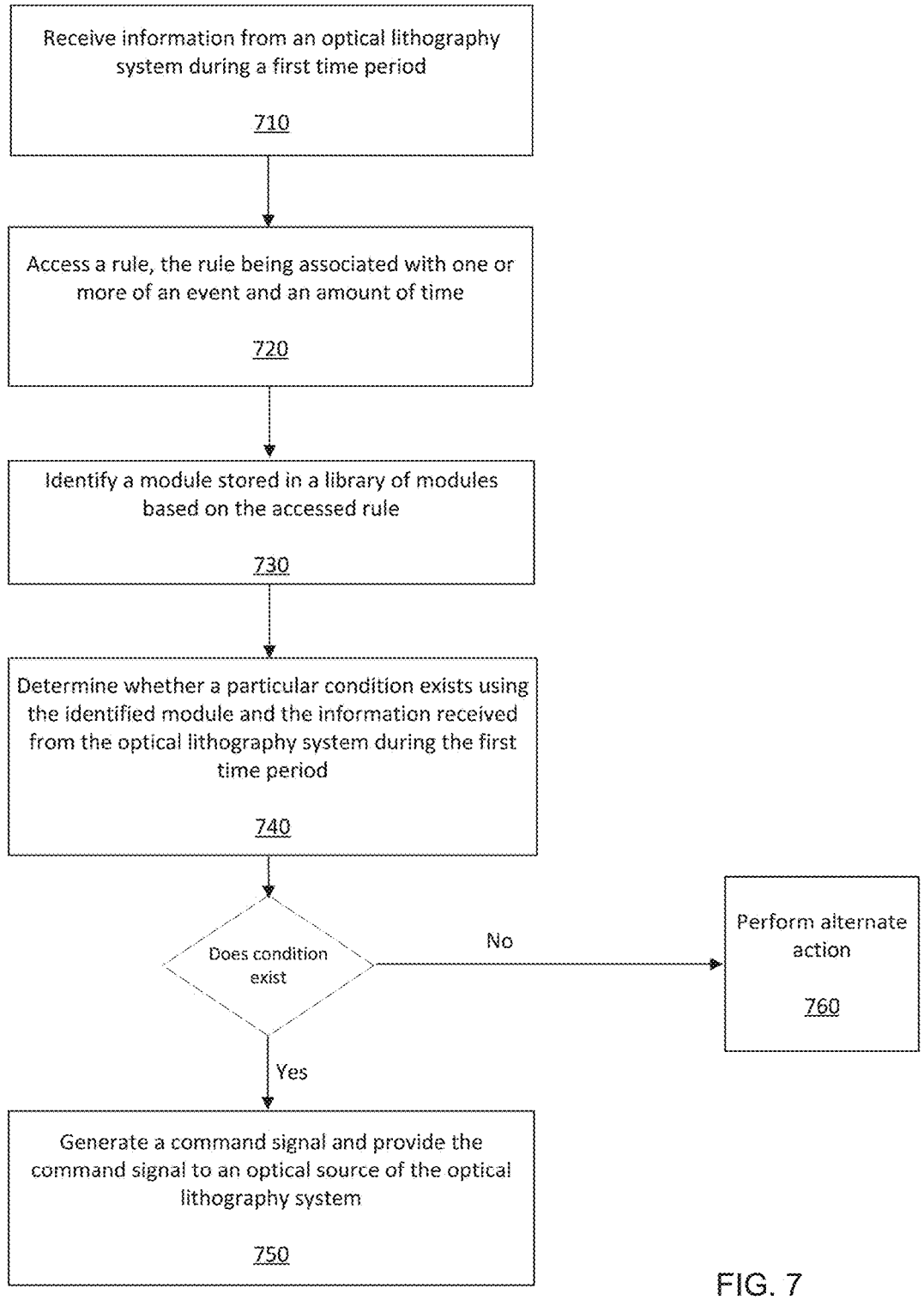
FIGS. 7 and 9 are flow charts of examples of processes that may be performed using the monitoring system of FIG. 3.

Moreover, and as discussed further with respect to FIGS. 3 and 7, the monitoring system 150 employs a collection of rules 153 that associate conditions of the optical source 105 and/or the optical lithography system 101 with various modules in a library of modules 155. The monitoring system 150 uses the rules 153 to select a particular module or modules from the library 155 to be executed. The monitoring system 150 executes the selected module or modules to determine if a particular condition exists on the optical source 105 and/or the optical lithography system 101, and may generate a command signal for the optical source 105. The command signal acts on the optical source 105 to adjust one or more operating parameters to, for example, correct or improve the performance of the optical source 105 and/or the optical lithography system 101.

The use of rules 153 and a library of modules 155 also brings consistency and robustness to the monitoring performed by the monitoring system 150. Such consistency and robustness may be challenging or unachievable through manual troubleshooting and monitoring. For example, the library of modules 155 may include a module that switches the optical source 105 to a diagnostic mode once a day based on a rule 153. In turn, this causes the optical source 105 to emit a pre-defined pattern of pulses while the monitoring system 150 collects data from the optical source 105. The data collected during the diagnostic mode is governed by the module executed by the monitoring system 150. Through the use of the module, the conditions for collecting data in that diagnostic mode are ensured to be the same over time and over different optical sources. This allows collection of a more robust and consistent data set than is possible with manual trouble shooting.

Figure 2A:
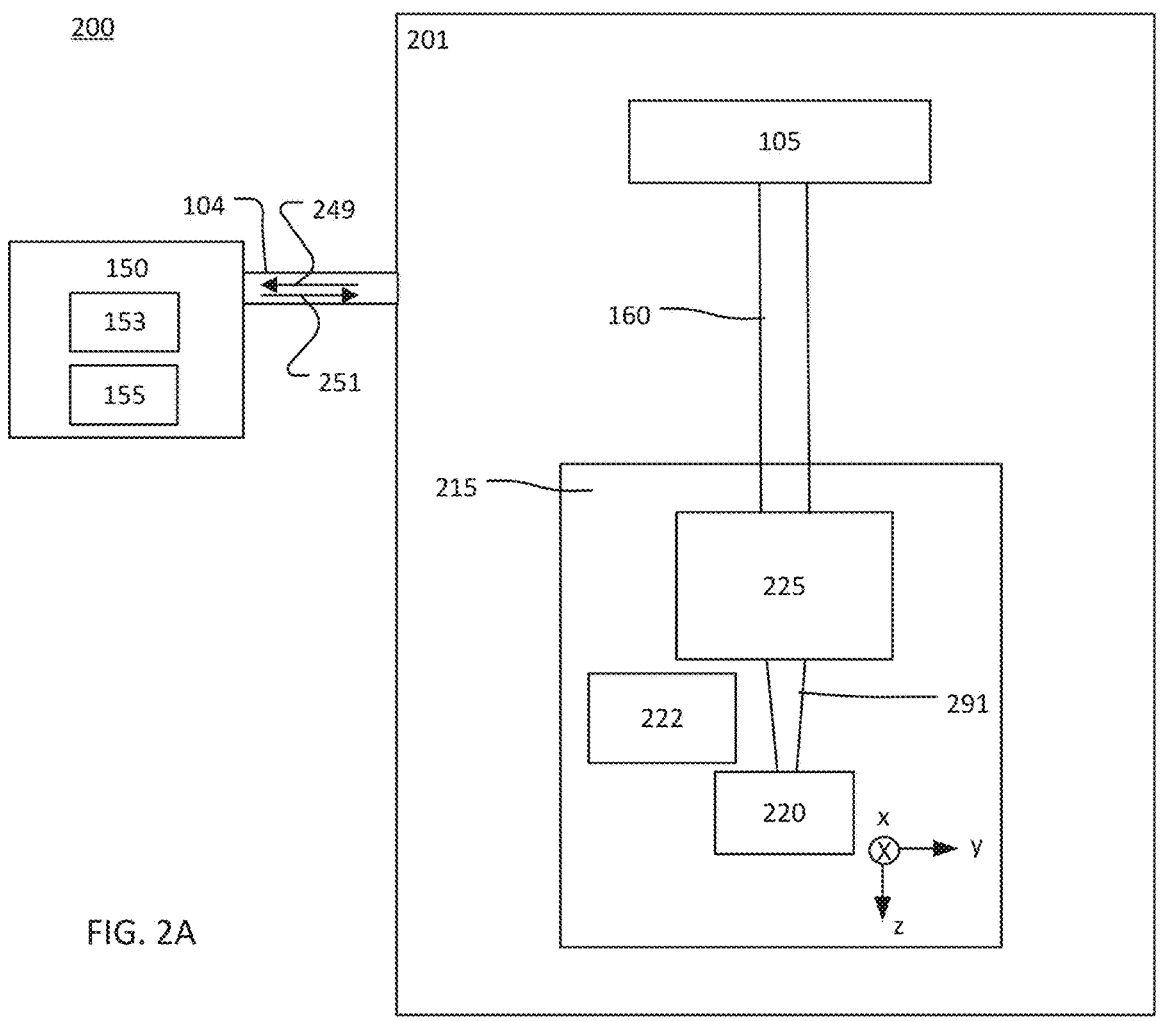
FIG. 2A is a block diagram of an example of an optical lithography system coupled to the monitoring system of FIG. 1.

Referring to FIG. 2A, a block diagram of a system 200 is shown. The system 200 shows an example in which the monitoring system 150 is coupled to an optical lithography system 201 via the data connection 104. The optical lithography system 201 is an example of an implementation of the optical lithography system 101 (FIG. 1). The optical lithography system 201 includes the optical source 105, which provides the optical beam 160 to a lithography apparatus 215 to process a wafer 220, which is received at a wafer region. The lithography apparatus 215 also may be referred to as a scanner. The optical beam 160 may be a pulsed optical beam that includes pulses of light separated from each other in time. The monitoring system 150 monitors the performance of the optical lithography system 201.

The lithography apparatus 215 includes a projection optical system 225, which receives the optical beam 160 and forms an exposure beam 291. The lithography apparatus 215 also may include a metrology system 222. The metrology system 222 may include, for example, a camera or other device that is able to capture an image of the wafer 220 or the exposure beam 291 at the wafer 220, an optical detector that is able to capture data that describes characteristics of the exposure beam 291, such as intensity of the beam 291 at the wafer 220 in the x-y plane, and/or any other device capable of measuring data that provides information about the beam 291 or the wafer 220. The lithography apparatus 215 may be a liquid immersion system or a dry system.

Figure 2B:
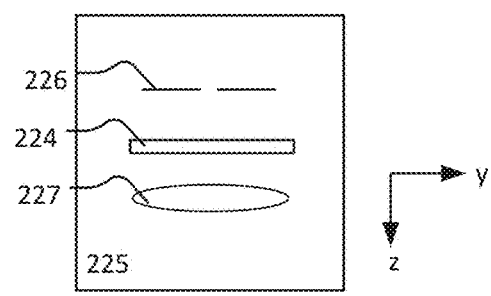
FIG. 2B is a block diagram of an example of a mask used in the optical lithography system of FIG. 2A.

Microelectronic features are formed on the wafer 220 by, for example, exposing a layer of radiation-sensitive photoresist material on the wafer 220 with the exposure beam 291. Referring also to FIG. 2B, the projection optical system 225 includes a slit 226, a mask 224, and projection optics 227. After reaching the projection optical system 225, the optical beam 160 passes through the slit 226. In the example of FIGS. 2A and 2B, the slit 226 is rectangular and shapes the optical beam 260 into an elongated rectangular shaped optical beam. Other shapes may be used. The shaped optical beam then passes through the mask 224. A pattern is formed on the mask 224, and the pattern determines which portions of the shaped optical beam are transmitted by the mask 224 and which are blocked by the mask 224. The design of the pattern is determined by the specific microelectronic circuit design that is to be formed on the wafer 220. The portions of the shaped optical beam that are transmitted by the mask 224 pass through (and may be focused by) the projection optics 227 and expose the wafer 220.

The monitoring system 150 may receive information 249 through the data connection 104 from any part of the optical lithography system 201. For example, the monitoring system 150 may receive information from the optical source 105 and/or the metrology system 222. The monitoring system 150 may receive information 249 from the optical lithography system 201 constantly, periodically, or the monitoring system 150 may poll the optical lithography system 201 and receive the information 249 in response. The monitoring system 150 provides the command signal 251 to the optical source 105 through the data connection 104.

FIG. 3 is a block diagram of a monitoring system 350. The monitoring system 350 is an example of an implementation of the monitoring system 150. In the example of FIG. 3, the monitoring system 350 is coupled to an optical source 305 of an optical lithography system 301 through a data connection 304. In the example of FIG. 3, the monitoring system 350 and the optical lithography system 301 are located in the same plant 392. The plant may be, for example, a wafer fabrication facility, room, or location. In some implementations, the plant 392 may include locations that are physically separate (such as different buildings) but are protected by the same electronic firewall.

The optical lithography system 301 and the data connection 304 may be used as, respectively, the optical lithography system 101 and the data connection 104 (FIGS. 1 and 2A). The optical source 305 is similar to the optical source 105 (FIGS. 1 and 2A). The optical source 305 provides an optical beam 360 to the lithography apparatus 215. In the example of FIG. 3, the monitoring system 350 receives information 349 from the optical source 305 and provides a command signal 351 to the optical source 305 through the data connection 304 and the data interface 306. The monitoring system 350 generates the command signal 351 based on the information 349 received from the optical source 305.

Figure 5:
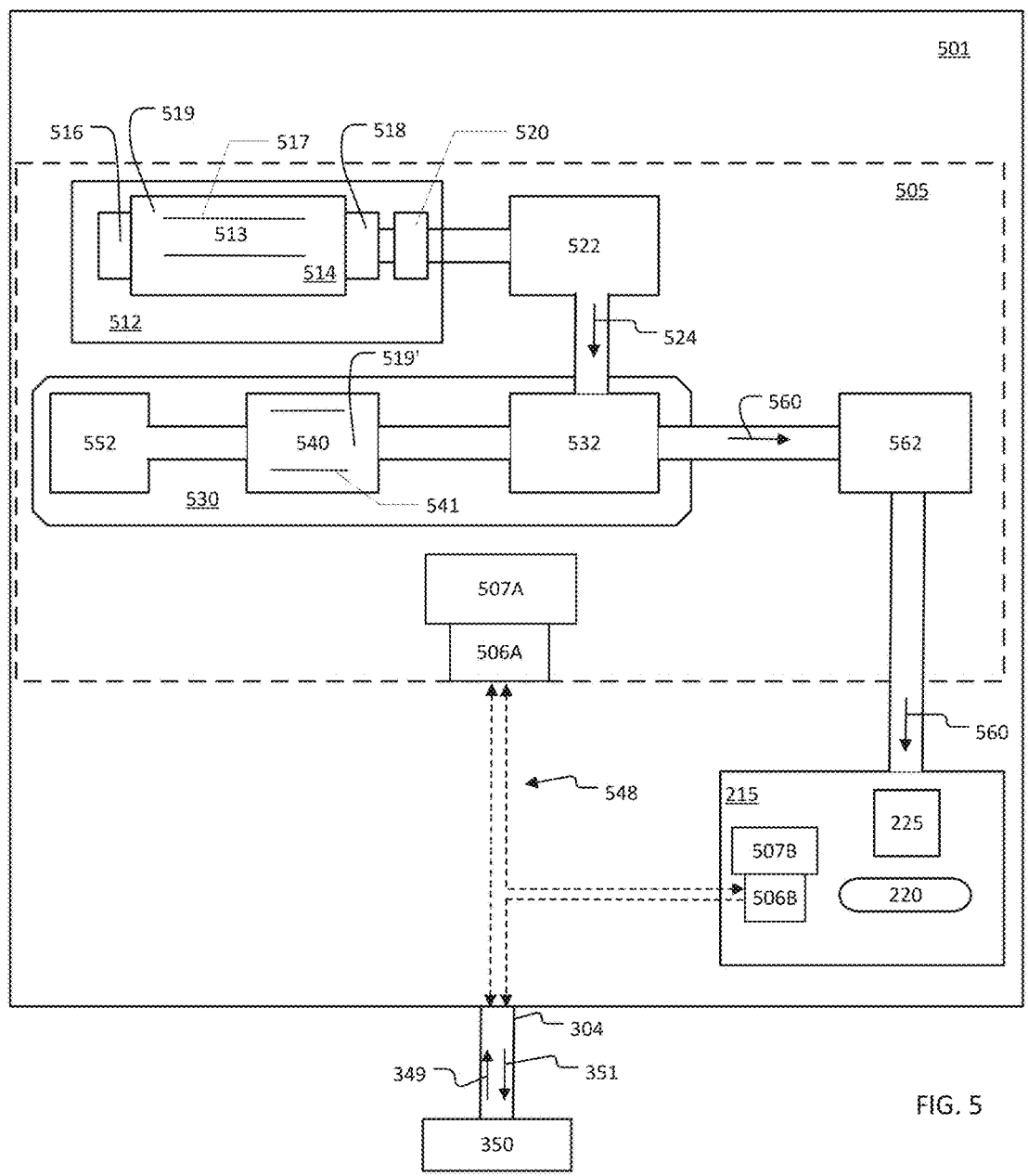
FIG. 5 is a block diagram of another example of an implementation of an optical lithography system.

In some implementations, the lithography apparatus 215 includes a data interface (not shown in FIG. 3) similar to the data interface 306 such that the monitoring system 350 also receives information from the lithography apparatus 215. FIG. 5 shows an example in which the lithography apparatus 215 includes a data interface. In these implementations, the monitoring system 350 uses a data connection similar to the data interface 306 to receive information 349 from the optical source 305 and the lithography apparatus 215.

The supervisor module 352 includes a collection of rules 353, a library of modules 355, and monitoring parameters 357. The library of modules 355 includes one or more modules that, when executed by the command signal engine 354, may produce the command signal 351. Each of the modules 355 may be, for example, a set of instructions that form a computer program or a subroutine. The modules 355 process and/or analyze the information 349 from the optical lithography system 301 to determine whether a particular condition exists in the optical lithography system 301. If the particular condition exists, the command signal engine 354 generates the command signal 351.

At any given time, the command signal engine 354 executes one or more of the modules in the library of modules 355. In some implementations, the command signal engine 354 executes one module at a time. In FIG. 3, the module executed by the command signal engine 354 is shown as a dashed rectangle and labeled 358. The collection of rules 353 governs which module or modules the command signal engine 354 executes.

Each rule in the collection 353 associates one or more modules in the library of modules 355 with an execution criteria. The collection of rules 353 may include, for example, rules that are time-based and rules that are event-based. The execution criteria of a time-based rule is based on the passage of a pre-defined amount of time. The execution criteria of an event-based rule is based on the occurrence of an event within the optical lithography system 301. For example, a time-based rule may indicate that the command signal engine 354 execute a certain module from the library of modules 355 each week or after a defined amount of time has passed since the previous execution of that module. An event-based rule may indicate that the command signal engine 354 execute a certain module from the library of modules 355 when the information 349 from the optical lithography system 301 indicates that a set number of pulses of light have been provided to the lithography apparatus 215.

The supervisor module 352 also includes the monitoring parameters 357. The monitoring parameters 357 are variables, settings, and/or quantities that govern the actions performed by the command signal engine 354 when the modules in the library of modules 355 are executed. Any of the monitoring parameters 357 may be used by more than one of the modules in the library of modules 355. The monitoring parameters 372 may be considered to be variables that are called or referenced by one or more of the modules. The monitoring parameters 357 may include, for example, module configuration parameters, configurations for time and event based rules, data feed rules, and/or protection filters.

The module configuration parameters are any values that are used to specify details of a behavior or action taken by a module. A configuration parameter may be, for example, a range of values used by a module that applies a threshold test to information from the optical lithography system 301 to determine whether a particular condition exists in the optical source 305. In some implementations, a module that monitors an aspect of the optical source 305 may analyze information from the optical lithography system 301 by comparing the data to the range of values. For example, the module may analyze data that indicates a pressure of a gaseous gain medium in an amplifier of the optical source relative to a pre-defined range. In this example, the pre-defined range of values is the configuration parameter. If the data from the optical source 305 indicates that the pressure is outside of the pre-defined range, the command signal 351 is generated and provided to the optical source 305.

When the optical source 305 receives the command signal 351, one or more operating parameters of the optical source 305 are adjusted to, for example, bring the pressure into the pre-defined range and/or enter a diagnostic mode. If the information 349 from the optical source 305 indicates that the pressure is within the predefined range, the module may perform an alternative action. For example, the module generates a log file that is stored at the electronic storage 362 instead of generating the command signal 351. In general, module configuration parameters may be used by any module. For example, any module that relates to gas pressure monitoring may be written to use the pre-defined range discussed in the above example.

In another example, module configuration parameters may contain information about which modules in the library of modules 355 are in an active state. That is, module configuration parameters may be used to enable or disable one or more modules in the library of modules 355.

Monitoring parameters 375 may also include configurations for time and event based rules that cause modules from the library of modules 355 to be executed by the command signal engine 354. In one example, a configuration for a time based rule is a particular amount of time that specifies how often a module is to be executed. In another example, a configuration for an event based rule is a particular value of an operating parameter of the optical lithography system 301 that must be exceeded in order to execute a corresponding module.

Data feed rules encompass another type of monitoring parameter 357 that specifies a data transfer action (for example, a transfer of data from the optical lithography system 301 to the monitoring system 350 via the data connection 304) that is to occur based on an event or the passage of a certain amount of time. For example, a data feed rule may specify that a certain operating parameter of the optical lithography system 301 should be transferred to the monitoring system 350 over the data connection 304 based on the occurrence of a certain event or a passage of a certain amount of time.

Protection filters are monitoring parameters that prevent certain actions from occurring regardless of other rules or modules. For example, protection filters may prevent some operating parameters of the optical lithography system 301 from being changed by the command signal 351, regardless of what its corresponding module in the library of modules 355 specified. In another example, protection filters also may be used to place limits on what the command signal 351 can change. In this example, a protection filter may prevent the issuance of a command signal 351 that would cause the optical source 305 to attempt to operate outside of its ordinary performance limits.

In some implementations, all or some of the monitoring parameters 357 are accessible to the operator of the monitoring system 350 such that the operator is able revise and/or add to the rules and/or the modules in the library of modules 355. In other implementations, the monitoring parameters 357 are not accessible to the operator of the monitoring system 350 and are set by the manufacturer at the time that the monitoring system 350 is commissioned. In yet other implementations, the monitoring parameters 357 are not accessible to the operator but may be changed based on pre-defined internal rules that are present when the monitoring system is commissioned.

The monitoring system 350 is implemented on a general purpose computer that includes an electronic processor 361, an electronic storage 362, and an I/O interface 363. The electronic processor 361 includes one or more processors suitable for the execution of a computer program such as a general or special purpose microprocessor, and any one or more processors of any kind of digital computer. Generally, an electronic processor receives instructions and data from a read-only memory, a random access memory (RAM), or both. The electronic processor 361 may be any type of electronic processor. The electronic processor 361 executes the instructions that make up the supervisor module 352, the command signal engine 354, the rules in the collection of rules 353, and the modules in the library of modules 355.

The electronic storage 362 may be volatile memory, such as RAM, or non-volatile memory. In some implementations, and the electronic storage 362 includes non-volatile and volatile portions or components. The electronic storage 362 may store data and information that is used in the operation of the monitoring system 350. For example, the electronic storage 362 may store the collection of rules 353, the library of modules 355, and the monitoring parameters 357. Instructions (for example, in the form of a computer program) that implement the supervisor module 352 and the command signal engine 354 also may be stored on the electronic storage 362. The electronic storage 362 also may store the information 349 received from the optical lithography system 301 and/or command signals 351 provided to the optical source 305.

The electronic storage 362 also may store instructions, perhaps as a computer program, that, when executed, cause the processor 361 to communicate with components in the optical source 305 and/or the lithography apparatus 215. For example, the instructions may be instructions that cause the electronic processor 361 to provide the command signal 351 generated by the command signal engine 354 to the optical source 305. In another example, the electronic storage 362 may store instructions that, when executed, cause the monitoring system 350 to interact with a separate machine. For example, the monitoring system 350 may interact with other optical lithography systems in the same plant 392. An example of a monitoring system that interacts with more than one optical lithography system is discussed with respect to FIGS. 4 and 9.

In some implementations, the monitoring system 350 may send data to a remote station 393 via a data link 394. The remote station 393 may be, for example, a computer server. The remote station 393 is not within the plant 392, and the remote station 393 is not configured to provide commands to the optical source 305 or any other part of the optical lithography system 301. The data link 394 may be any communications channel capable of transmitting data the plant 392 to a location outside of the plant 392. The data link 394 may transmit data via the Supervisory Control and Data Acquisition (SCADA) protocol or another services protocol, such as Secure Shell (SSH) or the Hypertext Transfer Protocol (HTTP).

The I/O interface 363 is any kind of interface that allows the monitoring system 350 to exchange data and signals with an operator, the optical source 305, one or more components of the optical source 305, the lithography apparatus 215, and/or an automated process running on another electronic device. For example, in implementations in which the monitoring parameters 357 may be edited, the edits may be made through the I/O interface 363. The I/O interface 363 may include one or more of a visual display, a keyboard, and a communications interface, such as a parallel port, a Universal Serial Bus (USB) connection, and/or any type of network interface, such as, for example, Ethernet. The I/O interface 363 also may allow communication without physical contact through, for example, an IEEE 802.11, Bluetooth, or a near-field communication (NFC) connection. The I/O interface 363 also may be used to connect the monitoring system 350 to the data link 394 and the remote station 393.

The command signal 351 is provided to the optical source 305 through the data connection 304. The data connection 304 may be a physical cable or other physical data conduit (such as a cable that supports transmission of data based IEEE 802.3), a wireless data connection (such as a data connection that provides data via IEEE 802.11 or Bluetooth), or a combination of wired and wireless data connections. The data that is provided over the data connection may be set through any type of protocol or format. For example, file transfer protocol (FTP) or the common object request broker architecture (CORBA) may be used to transmit the command signal 351 to the optical source 305 and/or receive the information 349 from the optical source 305.

The data connection 304 is connected to the data interface 356 of the monitoring system 350 and the data interface 306 of the optical source 305. The data interfaces 356 and 306 may be any kind of interface capable of sending and receiving data. For example, the data interfaces 356 and 306 may be an Ethernet interface, a serial port, a parallel port, or a USB connection. The data interfaces 356 and 306 may allow data communication through a wireless data connection. For example, the data interfaces 356 and 306 may be an IEEE 811.11 transceiver, Bluetooth, or an NFC connection. The data interfaces 356 and 306 may be identical data interfaces, or the data interfaces 356 and 306 may each have a different form. For example, the data interface 356 may be an Ethernet interface, and the data interface 306 may be a parallel port. In the example of FIG. 3, the data interface 306 is shown with the optical source 305. However, the lithography apparatus 215 also may have a data interface configured for communication with the monitoring system 350.

The optical source 305 includes the data interface 306, a control system 307 in communication with the data interface 306, and a subsystem 308 that is controlled by the control system 307. FIG. 3 shows one data interface 306, control system 307, and subsystem 308. However, the optical source 305 may include more than one data interface 306, control system 307, and/or subsystem 308.

The subsystem 308 is any type of system that is controllable to generate and/or direct the optical beam 360 and/or the exposure beam 291 (shown in FIG. 2). The subsystem 308 may include controllable physical devices, a system that is implemented in software, or a system that includes hardware and software aspects. For example, the subsystem 308 may be a collection of optical elements (such as prisms, mirrors, and/or lenses and associated mechanical components) that focus and steer the optical beam 360 within the optical source 305 and/or toward the lithography apparatus 215. In this example, the control system 307 may modify operating parameters related to the subsystem 308, such as the position, location, and/or orientation of the mechanical components to orient the optical components. In another example, the subsystem 308 may be a timing system that causes the optical source 305 to produce pulses of light at a particular repletion rate. The timing system may be implemented as software in, for example, a field-programmable gate array (FPGA) in the optical source 305 that communicates with the control system 307. In this example, the control system 307 may change the operating parameters of the timing system such that the repetition rate is changed.

The control system 307 is an electronic and software-based control system implemented on an embedded processor 309. The embedded processor 309 has different characteristics than the electronic processor 361 of the monitoring system 350. The embedded processor 309 is a real-time processor that is fast enough to execute control systems at least once per pulse of light generated by the optical source 305. Furthermore, the embedded processor 309 may consume less power and may be smaller than the electronic processor 361. The embedded processor 309 may include a central processing unit (CPU) and memory. However, the embedded processor 309 has less general processing power than the electronic processor 361, and less memory is available as compared to the electronic storage 362. Thus, the monitoring system 350 is able to perform computations that are more complex than the embedded processor 309 and is able to store more data. This allows the monitoring system 350 to perform data analysis that is challenging or impossible for the embedded processor 309 to perform. For example, the monitoring system 350 may analyze data that is collected from the optical source 305 over a period of days, weeks, and months.

The control system 307 is separate from the monitoring system 350, and the control system 307 is able to control the subsystem 308 independently of the command signal 351. However, the control system 307 is in communication with the data interface 306, and may receive information or commands from the monitoring system 350 through the data interface 306. For example, the control system 307 may change an operating parameter in the subsystem 308 based on information in the command signal 351 such that the monitoring system 350 is able to temporarily control the control system 307. In another example, the command signal 351 may change an operating parameter of the control system 307.

FIG. 4 is a block diagram of a system 400. The system 400 includes the monitoring system 350. FIG. 4 shows an example of the monitoring system 350 being used to monitor more than one optical lithography system. In the example of FIG. 4, the monitoring system 150 is coupled to optical lithography systems 401_1 to 401_n (each of which includes a respective optical source 405_1 to 405_n) via a respective data connection 404_1 to 404_n. Each of the optical sources 405_1 to 405_n may be similar to the optical source 105 (FIG. 1) or the optical source 305 (FIG. 3). Each of the data connections 404_1 to 404_n may be similar to the data connection 104 (FIG. 1) or 304 (FIG. 3).

The optical lithography systems 401_1 to 401_n are part of a group 403. The group 403 includes n optical lithography systems, where n is any number greater than zero. In the example shown in FIG. 4, the optical lithography systems 401_1 to 401_n are within the same plant 492. The plant 492 may be, for example, a wafer fabrication facility, room, or location. In some implementations, the plant 492 may include locations that are physically separate (such as different buildings) but are protected by the same electronic firewall. In some implementations, the systems 401_1 to 401_n in the group 403 may be disbursed in several different plants. For example, the systems 401_1 to 401_n may be systems that are owned by the same corporate entity, or systems that are used in the same way regardless of ownership or location.

The monitoring system 350 receives information from any or all of the optical lithography systems 401_1 to 401_n, analyzes the data, and provides command signals to any or all of the optical sources 405_1 to 405_n. In some implementations, the monitoring system 350 may provide data to the remote station 393 via the data link 394.

Prior to discussing the operation of the monitoring systems 150 and 350 further, additional details relating to an optical lithography system 501, which may be used as the optical lithography system 101 or the optical lithography system 301, are discussed.

FIG. 5 is a block diagram of the optical lithography system 501. In the optical lithography system 501, an optical source 505 produces a pulsed optical beam 560, which is provided to the lithography apparatus 215. The optical source 505 may be, for example, an excimer optical source that outputs the pulsed optical beam 560 (which may be a laser beam).

The optical source 505 also includes a control system 507A and a data interface 506A. The lithography apparatus 215 includes a control system 507B and a data interface 506B. The control systems 507A, 507B are similar to the control system 307 (FIG. 3), and the data interfaces 506A, 506B are similar to the data interface 306 (FIG. 3). Together, the control systems 507A, 507B control various operations of the optical lithography system 501, with the control system 507A controlling aspects of the optical source 505 and the control system 507B controlling aspects of the lithography apparatus 215. The control systems 507A, 507B are in communication with the data interfaces 506A, 506B, respectively.

The data interface 506A provides information from the optical source 505 to the data connection 304 and receives information and data (for example, the command signal 351) from the monitoring system 350. The data interface 506B provides information from the lithography apparatus 215 to the monitoring system 350. The data interfaces 306A and 306B also may exchange data and information with each other such that the control systems 507A and 507B are able to communicate with each other. The data interfaces 306A and 306B may communicate with each other and the monitoring system 350 via signal paths (shown as dashed lines and labeled as 548 in FIG. 5). The signal paths 548 may be any type of wired or wireless connection.

In the example shown in FIG. 5, the optical source 505 is a two-stage laser system that includes a master oscillator 512 that provides a seed optical beam 524 to a power amplifier 530. The master oscillator 512 and the power amplifier 530 may be considered to be subsystems of the optical source 505 or systems that are part of the optical source 505. In other words, the master oscillator 512 and power amplifier 530 are examples of a subsystem 308 discussed with respect to FIG. 3. The power amplifier 530 receives the seed optical beam 524 from the master oscillator 512 and amplifies the seed optical beam 524 to generate the optical beam 560 for use in the lithography apparatus 215. For example, the master oscillator 512 may emit a pulsed seed optical beam, with seed pulse energies of approximately 1 milliJoule (mJ) per pulse, and these seed pulses may be amplified by the power amplifier 530 to about 10 to 15 mJ. The duration of a pulse (also called the pulse width or length) may be the time during which the power of the pulse remains continuously above a percentage (for example, 50%) of its maximum value.

The master oscillator 512 includes a discharge chamber 514 having two elongated electrodes 517, a gain medium 519 that is a gas mixture, and a fan (not labeled in FIG. 5) for circulating gas between the electrodes 517. A resonator is formed between a line narrowing module 516 on one side of the discharge chamber 514 and an output coupler 518 on a second side of the discharge chamber 514. The line narrowing module 516 may include a diffractive optic such as a grating that finely tunes the spectral output of the discharge chamber 514. The output coupler 518 may include a partially reflective mirror that forms a resonator towards the discharge chamber and also delivers parts of the output optical beam away from the discharge chamber. The master oscillator 512 also includes a line center analysis module 520 that receives an output optical beam from the output coupler 518 and a beam coupling optical system 522 that may modify the size, shape, and/or direction of the output optical beam as needed to form the seed optical beam 524. The line center analysis module 520 is a measurement subsystem that may be used to measure or monitor the wavelength of the seed optical beam 524. The line center analysis module 520 may be placed at other locations in the optical source 505, or it may be placed at the output of the optical source 505.

The gas mixture used in the discharge chamber 514 may be any gas suitable for producing an optical beam at the wavelength and bandwidth required for the application. For an excimer source, the gas mixture may contain a noble gas (rare gas) such as, for example, argon or krypton, a halogen, such as, for example, fluorine or chlorine and traces of xenon apart from helium and/or neon as buffer gas. Specific examples of the gas mixture include argon fluoride (ArF), which emits light at a wavelength of about 193 nm, krypton fluoride (KrF), which emits light at a wavelength of about 248 nm, or xenon chloride (XeCl), which emits light at a wavelength of about 351 nm. The excimer gain medium (the gas mixture) is pumped with short (for example, nanosecond) current pulses in a high-voltage electric discharge by application of a voltage to the elongated electrodes 517. The specific amount of different gases used in the mixture of gas in the discharge chamber 514 is another example of an operating parameter of the optical source 505.

The power amplifier 530 includes a beam coupling optical system 532 that receives the seed optical beam 524 from the master oscillator 512 and directs the optical beam through a discharge chamber 540, and to a beam turning optical element 552, which modifies or changes the direction of the optical beam so that it is sent back into the discharge chamber 540. The discharge chamber 540 includes a pair of elongated electrodes 541, a gain medium 519' that is a gas mixture, and a fan (not shown in FIG. 5) for circulating the gas mixture between the electrodes 541.

The output optical beam 560 is directed through a bandwidth analysis module 562, where various operating parameters (such as the spectral bandwidth or the wavelength) of the beam 560 may be measured. The output optical beam 560 may also be directed through a pulse stretcher (not shown in FIG. 5), where each of the pulses of the output optical beam 560 is stretched in time, for example, in an optical delay unit, to adjust for performance properties of the optical beam that impinges the lithography apparatus 215.

The control system 507A may be connected to various components and subsystems of the optical source 505. The control system 507A controls low-level operations of the optical source 105 by adjusting the operating parameters of the optical source 505. For example, the control system 507A may control when the optical source 505 emits a pulse of light or a burst of light pulses that includes one or more pulses of light. The optical beam 560 may include one or more bursts that are separated from each other in time. Each burst may include one or more pulses of light. In some implementations, a burst includes hundreds of pulses, for example, 100-400 pulses. The number of pulses in a burst is another example of an operating parameter of the optical source 505. In the control system 507A, the number of pulses in a burst may be a changeable operating parameter. A control signal from the monitoring system 350 may, when operating in a diagnostic mode, change the number of pulses in a burst by changing the value a corresponding operating parameter in the control system 507A. Furthermore, the number of pulses in a burst may be one of the monitoring parameters 357 discussed with respect to FIG. 3.

Figure 6A:
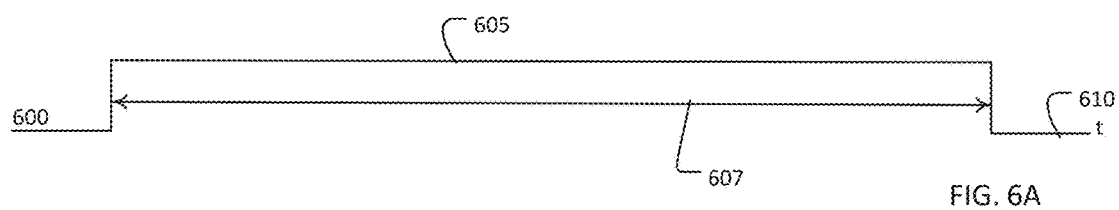
FIGS. 6A-6C are graphs of signals that may be used to control an optical source that is part of the optical lithography system of FIG. 5.
Figure 6B:
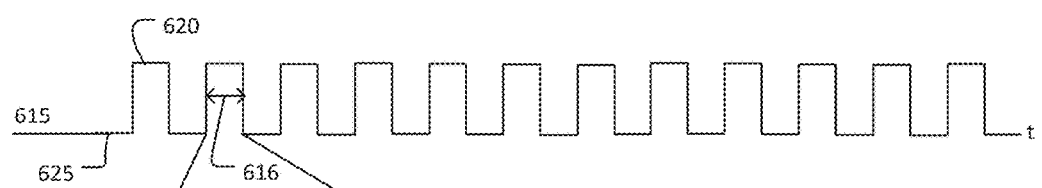
Figure 6C:
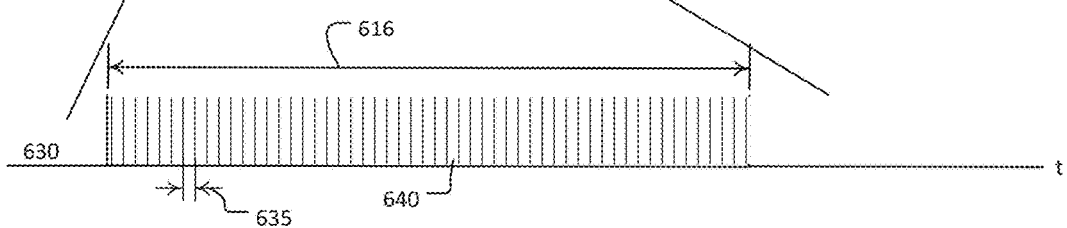

FIGS. 6A-6C provide an overview of the production of pulses in the optical source 505. FIG. 6A shows an amplitude of a wafer exposure signal 600 as a function of time, FIG. 6B shows an amplitude of a gate signal 615 as a function of time, and FIG. 6C shows an amplitude of a trigger signal as a function of time.

The control system 507B and the data interface 506B may be configured to send the wafer exposure signal 600 to the data interface 506A of the optical source 505 to control the optical source 505 to produce the optical beam 560. In the example shown in FIG. 6A, the wafer exposure signal 600 has a high value 605 (for example, 1) for a period of time 607 during which the optical source 505 produces bursts of pulses of light. The wafer exposure signal 600 otherwise has a low value 610 (for example, 0) when the wafer 120 is not being exposed.

Referring to FIG. 6B, the optical beam 560 is a pulsed optical beam, and the optical beam 560 includes bursts of pulses. The control system 507B also controls the duration and frequency of the bursts of pulses by sending a gate signal 615 to the data interface 506A of the optical source 505. The gate signal 615 has a high value 620 (for example, 1) during a burst of pulses and a low value 625 (for example, 0) during the time between successive bursts. In the example shown, the duration of time at which the gate signal 615 has the high value is also the duration of a burst 616. The bursts are separated in time by an inter-burst time interval. During the inter-burst time interval, the lithography apparatus 215 may position the next die on the wafer 220 for exposure.

Referring to FIG. 6C, the control system 507B also controls the repetition rate of the pulses within each burst with a trigger signal 630. The trigger signal 630 includes triggers 640, one of which is provided to the optical source 505 to cause the optical source 505 to produce a pulse of light. The control system 507B and the data interface 506B may send a trigger 640 to the data interface 506A of the optical source 505 each time a pulse is to be produced. Thus, the repetition rate of the pulses produced by the optical source 505 may be set by the trigger signal 630. The repetition rate is the inverse of the time between two successive pulses. The time between two successive pulses is labeled in FIG. 6C as element 635. The repetition rate of the pulsed beam 560 is another example of an operating parameter of the optical source 505.

As discussed above, when the gain medium 519 is pumped by applying voltage to the electrodes 517, the gain medium 519 emits light. When voltage is applied to the electrodes 517 in pulses, the light emitted from the medium 519 is also pulsed. Thus, the repetition rate of the pulsed optical beam 560 is determined by the rate at which voltage is applied to the electrodes 517, with each application of voltage producing a pulse of light. The pulse of light propagates through the gain medium 519 and exits the chamber 514 through the output coupler 518. Thus, a train of pulses is created by periodic, repeated application of voltage to the electrodes 517. The trigger signal 630, for example, may be used to control the application of voltage to the electrodes 517 and the repetition rate of the pulses, which may range between about 500 Hz and 6,000 Hz for most applications. In some implementations, the repetition rate may be greater than 6,000 Hz, and may be, for example, 12,000 Hz or greater.

The control system 507A may also be used to control the electrodes 517, 541 within the master oscillator 512 and the power amplifier 530, respectively, for controlling the respective pulse energies of the master oscillator 512 and the power amplifier 530, and thus, the energy of the optical beam 560. There may be a delay between the signal provided to the electrodes 517 and the signal provided to the electrodes 541. The amount of delay is another example of an operating parameter of the optical source 505. For example, the amount of delay may influence the spectral bandwidth of the pulsed optical beam 560. In this example, the spectral bandwidth of a pulse of the seed optical beam 524 may vary in time, with the front edge (the portions of the pulse that occur first in time) having the highest spectral bandwidth and the later-occurring portions of the pulse having the least spectral bandwidth. The delay between the signal provided to the electrodes 517 and the signal provided to the electrodes 541 determines which portion of the pulse is amplified. Thus, a larger delay results in a pulse with a greater spectral bandwidth and a shorter delay results in a pulse with a lower spectral bandwidth. The pulsed optical beam 560 may have an average output power in the range of tens of watts, for example, from about 50 W to about 130 W.

Referring to FIG. 7, a flow chart of a process 700 is shown. The process 700 is an example of a process that may be performed by the monitoring system 150 or 350. The process 700 is discussed with respect to the monitoring system 350 (FIGS. 3 and 5) and the optical lithography system 501 (FIG. 5).

Information is received from the optical lithography system 510 during a first period (710). The first period may be any amount of time. For example, the first period may be a time that is greater than the time between two successive pulses of a pulsed optical beam produced by the optical source 505. The information received from the optical lithography system 510 may be any information related to a condition of the optical source 505 or the optical lithography system 501. A condition is any property of the optical source 505, or the optical lithography system 501, that relates to the performance of the optical source 505 or the optical lithography system 501.

The information received from the optical lithography system 501 may include, for example, measured data obtained by, for example, a detector or sensor system in the optical source 505 or outside of the optical source 505. For example, the received information may include one or more of a repetition rate of the optical beam 560, a number of pulses produced by the optical source 505, a number of bursts produced by the optical source 505, a measured intensity of a pulse of the optical beam 560, a measured uniformity of a pulse of the optical beam 560, a spectral bandwidth of the optical beam 560, a wavelength of the optical beam 560, and/or a measured temperature and/or pressure of a gaseous gain medium of a discharge chamber of the optical source.

The information received from the optical lithography system 501 may include measured information from the lithography apparatus 215. For example, the information may include an indication of the dose provided at the wafer 220 (amount of optical energy per unit area at a wafer received in the lithography apparatus of the optical lithography system), and a measurement of a peak intensity of an exposure beam at a wafer received in the lithography apparatus of the optical lithography system.

Additionally or alternatively, the information received from the optical lithography system 501 may include information associated with the control system 507A and/or 507B, such as a setting or parameter used in the control system 507A and/or 507B. For example, the information may include a loop gain associated with the control system 507A and/or 507A, an operating point associated with the control system 507A and/or 507A, and/or operating limits imposed by the control system 507A and/or 507A.

The information received from the optical lithography system 501 and/or the optical source 505 is related to a condition of the optical source 505 and/or the optical lithography system 501. The condition of the optical source 505 may be, for example, a state or mode that indicates the performance of the optical source 505. For example, the condition of the optical source 505 may be any of (but not limited to): expected performance, the presence of a certain kind of fault, fault likely, offline, or scheduled service due. The condition of the optical lithography system 501 may be related to, for example, a dose error. Other conditions are possible, and specific examples of conditions are discussed further below. For example, FIGS. 8A-8D provide an illustration of an example of determining that a fault condition known as a dropout exists.

The information may be received from the optical lithography system 501 and/or the optical source 505 periodically and without the monitoring system 350 taking action. For example, the optical source 505 may provide a pre-defined set of information on a periodic basis through the data connection 304 based on monitoring parameters such as data feed rules. In other implementations, the monitoring system 350 may poll or request information from the optical source 505 and/or the optical lithography system 501 on a periodic, random, or constant basis. In yet other implementations, the monitoring system 350 receives the information from the optical source 505 by retrieving a log file that resides on the optical source 505. For example, the control system 507A may generate a log file that includes a measured value of an operating parameter. In some implementations, the monitoring system 350 may poll or request information from the optical lithography system 501 based on a time-based rule in the collection of rules 353. For example, a rule in the collection of rules 353 may specify that certain information be obtained from the optical source 505 after the optical source 505 has produced one million pulses.

A rule from the collection 353 is accessed (720). The rules in the collection of rules 353 are associated with, for example, (a) an event in the optical source 505 and/or the optical lithography system 501 and/or (b) a passage of a certain amount of time (for example, a week, month, or year). An event in the optical source 505 may be, for example, production of a certain number of pulses. The rules of the collection 353 are also associated with one or more of the modules in the library of modules 355. A module stored in the library of modules 355 is identified based on the rule (730). The rules in the collection 353 associate an event or a passage of time with one or more of the modules in the library 355. Thus, the rule accessed in (720) indicates a module or modules to select for execution by the command signal engine 354.

In one implementation, the collection of rules 353 is stored in the electronic storage 362 as a rule file that is accessed by the supervisor module 352 and/or the command signal engine 354. In this implementation, the collection of rules 353 includes a list of modules in the library of modules 355 and a time until the next scheduled execution for each module. In this implementation, the supervisor module 352 runs in an infinite loop that identifies modules in the library 355 using information in the rule file that contains the collection of rules 353. For each iteration of the supervisor module 352 (each pass through the loop), the time associated with each module listed in the rule file is decremented by the amount of time elapsed since the most recent iteration of the supervisor module 352. When a time associated with a module reaches zero (or some other pre-defined value), the command signal engine 354 executes that module.

Other implementations are possible. For example, some or all of the modules in the list may be associated with an event in addition to or instead of a time. If the event occurs after the most recent iteration of the supervisor module 352, then the module or modules associated with that event are executed by the command signal engine 354. An event may be, for example, the generation of a certain number of pulses of light and/or a measured value (such as wavelength or repetition rate) exceeding a threshold or being outside a pre-defined range of values. Yet another example of an event is the occurrence of a fault condition, such as a dropout (described in detail later) or the optical source not being able to maintain the specified output power level.

Furthermore, the modules that are on the list in the rule file may include fewer than all of the modules in the library of modules 355. In some implementations, the modules that are included in the list of modules may be selected by an operator of the optical lithography system 501 from all of the available modules in the library 355 through the I/O interface 363. In some implementations, the modules that are on the list in the rule file may be locked such that only a pre-defined set of modules is available for execution by the command signal engine 354.

Whether a particular condition exists in the optical source 505 and/or the optical lithography 501 is determined using the identified module and the received information (740). The module or modules identified in (730) are executed by the command signal engine 354. The executed module or modules process the information from the optical lithography system 501 to determine whether a condition exists in the optical source 505. For example, the modules include logic for processing and analyzing the information from the optical source 505. In one implementation, the information received from the optical source 505 and/or the optical lithography system 501 during a time period is compared to stored information. For example, the information received from the optical source 505 and/or optical lithography system 501 may be compared to the same type of information that was received and stored in the electronic storage 362 at an earlier time, and the difference may be compared to a pre-defined threshold. If the threshold is met or exceeded, the existence of a particular condition is declared. FIGS. 8A-8D discuss an example of a drop out condition being declared.

In another implementation, the information received from the optical lithography system 501 is analyzed by the module to determine or estimate a value or metric relating to one or more operating parameters of the optical source 505 over a relatively long period of time (for example minutes, hours, or days). The determined or estimated value of the operating parameter is compared to a stored value (or range of values) that represents the expected value (or range of values) for that operating parameter. If the determined or estimated value of the operating parameter is outside of an expected range or different from an expected value for that operating parameter, the existence of a particular condition is declared.

If a particular condition exists, the command signal engine 354 generates the command signal 351, and the command signal 351 is provided to the optical source 505 through the data connection 304 (750). The command signal 351 may be based on the particular condition declared.

If no condition is declared to exist, the monitoring system 350 may take an alternate action (760). The alternate action may be any action that the monitoring system 350 may perform other than generating and providing the command signal 351 to the optical source 505. For example, the monitoring system 350 may generate a log file for storage on the electronic storage 362, store the information received from the optical lithography system 501 during the time period on the electronic storage 362, and/or generate a notice that is perceivable to an operator of the lithography system 501 that indicates that the monitoring system 350 is not taking any action for now.

Thus, the process 700 may be used to determine the existence a condition in the optical source 505 or the optical lithography system 501 and to take action responsive to the existence of the condition. For example, and referring also FIGS. 8A-8D, the process 700 may be used to determine whether a dropout condition exists in the optical source 505, and, if the condition exists, adjust a blower speed (for example, rotations per minute) of the fan that circulates the gas in the master oscillator chamber 514. A dropout condition exists when voltage is applied to the electrodes 517 but the amount of optical energy produced by the master oscillator 512 is far less than expected or no optical energy is produced.

Figure 8A:
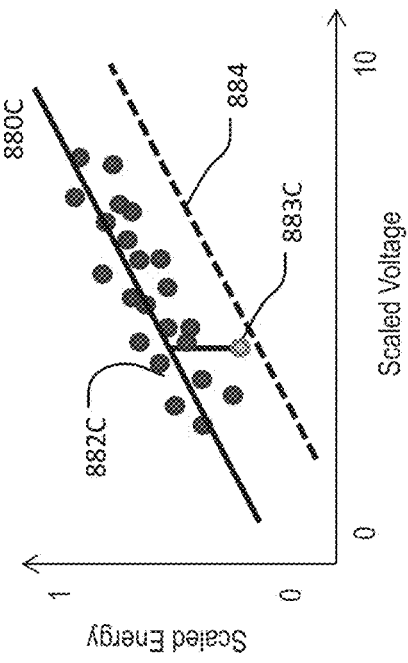
FIGS. 8A-8D show examples of information received from an optical lithography system.

FIG. 8A shows an example of the beam quality (BQ) count 801 as a function of time. The BQ count indicates how many beam quality events have occurred in the optical source 505. The example of FIG. 8A is a cumulative plot of BQ count that shows the total number of beam quality events that have occurred since a time prior to the time 0 on the horizontal axis. For example, FIG. 8A may show the total number of beam quality events that have occurred since the optical source 505 was turned on.

A beam quality event occurs when any aspect of the beam 560 does not meet a pre-defined specification. For example, a beam quality event occurs when the beam 560 has an optical energy, spectral bandwidth, and/or wavelength outside of an accepted range of values. An increase in the BQ count may indicate that a fault condition is present, but the BQ count alone is insufficient to determine that a dropout (or any other specific error) has occurred. In the example shown in FIG. 8A, the BQ count 801 includes increases 885 and 886, each of which indicate the occurrence of one more beam quality event at a particular time. However, only the increase 886 is caused by a dropout. A control system (such as a general feedback controller or the control system 507A or 507B) that operates on pulse-to-pulse data without being capable of analyzing a relatively large amount of data may incorrectly identify a dropout condition. By using more sophisticated processing than is practical with the control system 307 and by using information in addition to the BQ count, the monitoring system 350 is able to correctly identify the dropout and only increases the fan speed for an actual dropout.

In this example, the collection of rules 353 includes a beam quality rule that associates a change in the beam quality count with a dropout detection module in the library of modules 355. The beam quality rule is an example of an event-based rule that causes the dropout detection module to be identified by the rule and executed by the command signal engine 354 whenever there is an increase in the beam quality count. The monitoring system 350 receives the beam quality count information from the optical source 505. In some implementations, the control system 507A provides data to the monitoring system 350 when the beam quality count value changes. In some implementations, the monitoring system 350 receives the beam quality count value on a periodic basis and determines whether the beam quality count has changed.

Figure 8C:
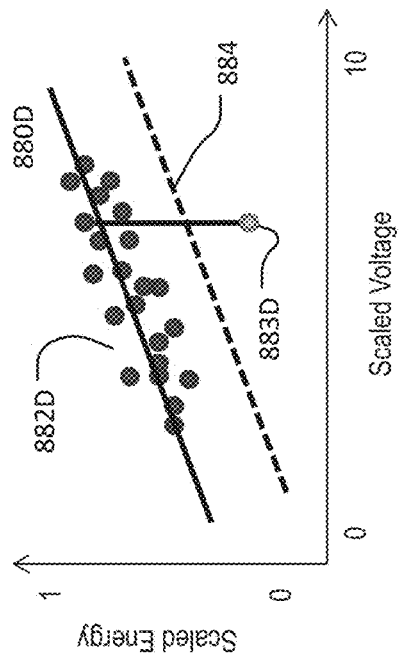

The command signal engine 354 executes the dropout detection module in response to the increase 885. The dropout detection module includes logic or instructions arranged in the form of a computer program that, when executed by the command signal engine 354, cause the monitoring system 350 to process and analyze voltage and energy data from the optical source 505. For example, the monitoring system 350 may request a log file from the optical source 505 (for example, by an FTP call). The log file includes energy and voltage data for a window of pulses around that include the pulse that occurred at or nearly at the same time as the increase in the beam quality count 885. FIG. 8C shows an example of data indicating energy as a function of voltage that is in the log file received from the optical source 505. The window may include any number of pulses (for example, 10,000 pulses). In some implementations, the size of the window may be set through the monitoring parameters 357.

When executed, the dropout detection module estimates the slope of a line 880C, which is fit to the energy versus voltage data 882C received from the optical source 505. The energy and voltage data is shown as solid dots in FIG. 8C. Data points (measured energy and voltage for particular pulses) are compared to the line that fits the data to identify outliers. Outliers are data points that have a measured energy that is more than a threshold distance below the expected energy. The expected energy is determined from the slope of the line 880C and the value of the voltage. The data point with the largest deviation from the expected energy is identified and compared to a dropout threshold 884. In FIG. 8C, the data point with the largest energy deviation is labeled as outlier 883C. The dropout detection module executing on the command signal engine 354 compares the amount of energy deviation for outlier 883C to the threshold 884. If the amount exceeds the threshold 884, the data point is deemed to represent a dropout. In the example of FIG. 8C, the outlier 883C does not exceed the threshold 884, thus, the command signal engine 354 does not generate the command signal 351.

The command signal engine 354 executes the dropout detection module again in response to the increase 886. The monitoring system 350 receives information from the optical lithography system 501 that includes the voltage and energy for pulses in a window that includes the pulse where the increase 886 occurred. The logic of the dropout detection module analyzes the energy and voltage data 882D (shown as dots) for the pulses to determine a line that fits the data. This line is shown as the line 880D in FIG. 8D. The line 880D may have a different slope than the line 880C. The measured energy for each voltage point is compared to the expected energy. The data point with the largest difference in actual and expected energy is identified as the largest outlier and is labeled 883D. The outlier 883D is compared to the dropout threshold 884 and is determined to exceed the dropout threshold 884. Thus, the outlier 883D is deemed to be a dropout, and a dropout condition is declared to exist in the optical source 505.

In response to declaring that a dropout condition exists, the command signal engine 354 generates the command signal 351. The command signal 351 is based on the particular condition and may be informed by the module that the command signal engine 354 executed to determine that the condition exists. For example, the dropout condition may be mitigated by increasing the speed of the fan in the master oscillator 512. Thus, the dropout detection module may include logic that specifies that the command signal 351 include information (such as voltage and/or current values) that, when provided to the control system 507A of the optical source 505, will result in the speed of the fan increasing by a certain amount and/or adjust a set point of the fan stored in the control system 507A.

Figure 8B:
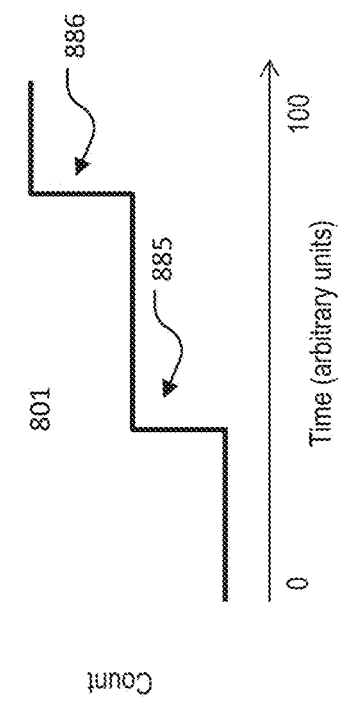
Figure 8D:
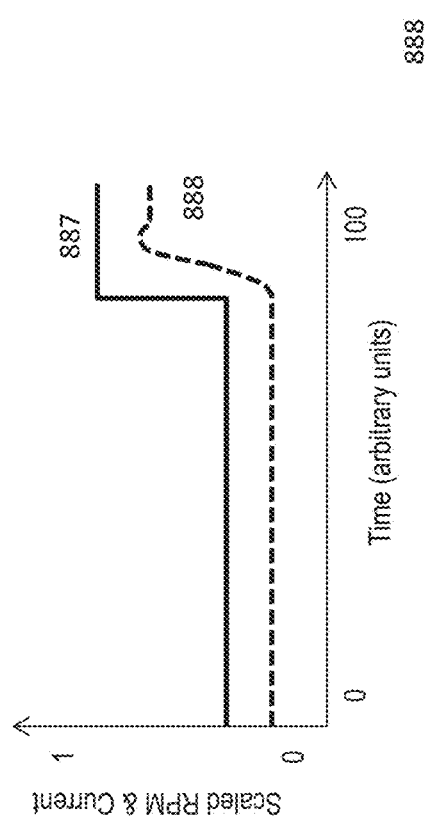

FIG. 8B shows plots 887 and 888 of the electrical current drawn by the fan and the set point of the fan (for example, in RPM), respectively. FIG. 8B shows scaled or normalized RPM and current values. As shown by comparing FIGS. 8A and 8B, the current drawn and the set point are only changed by the monitoring system 350 when the dropout condition exists in the optical source 505. The increase in RPM 887 coincides with the increase in BQ count 886 and the declaration of a dropout condition associated with the data in FIG. 8D. The horizontal axis of FIGS. 8A and 8B is time in arbitrary units. However, the total time shown in FIGS. 8A and 8B is much greater than the time between two subsequent pulses of light emitted from the optical source 505 when the optical source 505 produces pulses at 6,000 Hz.

The example discussed with respect to FIGS. 8A-8D shows how the monitoring system 350 is able to detect the presence of a condition in the optical source 505 and/or the optical lithography system 501 and correct or mitigate for the condition. The condition detected by the monitoring system 350 is one that would not typically be detectable by the control system 507A due to the complexity of the detection process and the amount of data analyzed to determine that the dropout condition exists. Additionally, as indicated by FIG. 8B, the monitoring system 350 may provide the command signal 351 to the optical source 505 and change the set point of the fan (which is an operating parameter) without interfering with the operation of the optical source 505. In this example, the fan continues to operate and draw current even though the set point is changed.

Referring to FIG. 9, a flow chart of a process 900 is shown. The process 900 provides an example of using the monitoring system 350 to monitor a group of optical lithography systems and change the behavior of the systems in the group based on the monitored performance. The process 900 may be performed by the monitoring system 350 when the monitoring system 350 is connected to more than one instance of the optical source 505 or optical lithography system 501. FIG. 4 shows a block diagram of an example of an implementation in which the monitoring system 350 is connected to a plurality of optical lithography systems 401_1 to 401_n that are part of a group 403. Each of the optical lithography systems 401_1 to 401_n may be implemented as an instance of the optical lithography system 501. Each of the optical lithography systems 401_1 to 401_n includes a respective optical source 405_1 to 405_n. The optical sources 405_1 to 405_n may be implemented as instances of the optical source 505.

Information from one of the optical lithography systems 401_1 to 401_n is received by the monitoring system 350 (910). For the discussion of FIG. 9, the monitoring system 350 receives information from the optical lithography system 401_1, but the information may be received from any of the systems in the group 403. Moreover, the monitoring system 350 may receive information from more than one of the optical lithography systems 401_1 to 401_n.

It is determined that a particular condition exists in the optical lithography system 405_1 (920). The elements (710)-(740) of the process 700 may be used to determine that a particular condition exists. Updated values for one or more operating parameters of the optical source 405_1 are determined based on the determined condition (930). The one or more operating parameters are changed at any of the optical sources 405_1 to 405_n to the determined updated values (940). The one or more operating parameters may be updated by generating and providing a command signal such as discussed with respect to element (750) of the process 700.

As noted above, for this example, each of the optical sources 405_1 to 405_n is implemented as an instance of the optical source 505 (FIG. 5). An example of using the process 900 for group performance management is provided next.

The gas in the master oscillator 512 may be a mixture of gases that includes neon and fluorine. After the group 403 is initially deployed, the control system 507A in each of the optical sources may be updated to allow operation with less of one of the gases. The update may, for example, change the operating parameters of the optical sources such that the minimum and maximum amounts of neon and/or fluorine gas injected into the chamber 514 and/or the amount of time between injections of either of the gases are changed from the default values.

The monitoring system 350 receives information from the optical lithography systems 401_1 to 401_n after the update. In this example, the monitoring system 350 receives information from the optical lithography systems 401_1 to 401_n and the optical sources 405_1 to 405_n. For example, the monitoring system 350 receives dose information that indicates an amount of optical energy per unit area received at a wafer that is exposed using light from the optical sources 405_1 to 405_n from the optical lithography systems 401_1 to 401_n. The monitoring system 350 may also receive an indication of the amount of neon gas that is injected into the chamber 514 and an amount of voltage that is applied to the electrodes 517 from each of the optical sources 405_1 to 405_n. The monitoring system 350 receives this information over a relatively long period of time (for example, days or weeks) and analyzes the received information using one or more modules in the library of modules 355. Using the received information, the monitoring system 350 determines that dropouts or other errors in the dose are occurring in some of the optical lithography systems of the group 403 only when the maximum amount of one of the gases is being injected into the optical sources of those optical lithography systems.

Based on determining that dropout or dose error conditions exists more frequently when the maximum amount of one of the gases is injected, the monitoring system 350 generates a command signal to reduce the operating parameter of the optical sources 405_1 to 405_n that relates to maximum amount of gas that is injected into the discharge chamber 514. Although the dose error condition or dropout condition is observed on fewer than all of the optical lithography systems and optical sources in the group 403, because the monitoring system 350 determines that reducing the maximum amount of gas that may be introduced into the chamber 514 reduces the occurrence of a dropout or dose error condition, the monitoring system 350 may provide the command signal to all of the optical sources in the group 403 to help reduce the probability of dose errors and dropout conditions occurring in the other optical lithography systems of the group 403.

The monitoring system may continue to monitor the optical lithography systems of the group 403 after providing the command signal that updates the operating parameters. Although the optical lithography systems in the group 403 are nominally identical and operate in the same manner, actual performance may vary due to, for example, manufacturing and installation variations. If the performance of any of the optical lithography systems in the group 403 degrades after the change, the monitoring system 350 may issue a command signal to reverse the changes made to that optical source.

In some implementations, the monitoring system 350 is connected to the remote station 493 (FIG. 4). In these implementations, the monitoring system 350 may be configured to send a report or other notice to the remote station 493 indicating that the operating parameters related to the maximum amount of gas that is allowed to be injected into the chamber 514 have been changed in the optical sources 405_1 to 405_n of the group 403. The monitoring system 350 also may provide information related to the operating conditions of the optical sources 405_1 to 405_n to the remote station 493. The remote station may be connected to other instances of the monitoring system 350 that are in turn connected to other groups similar to the group 403. The other groups and the group 403 may be owned and controlled by the same producer or corporate entity, and all of these groups may include similar equipment operating under similar conditions. The remote station 493 and the other instances of the monitoring system 350 may communicate such that the notice of the change made in the group 403 is received at the other instances of the monitoring system, although the remote station 493 does not control the optical sources or the optical lithography systems of the other groups directly. However, the other instances of the monitoring system may take action to update the optical sources in the other groups if appropriate.

Other implementations are within the scope of the claims. The examples discussed above are not exhaustive, and the processes 700 and 900 may be used to determine a variety of conditions in the optical lithography system 501 and/or the optical source 505 and to take a range of corrective actions. For example, the process 700 may be used to determine that a more optimal operating point exists for any aspect of the optical source 505. As discussed with respect to FIGS. 5 and 6A-6C the time delay between the firing of the electrodes 517 and 541 is an example of an operating parameter of the optical source 505. The monitoring system 350 may determine that the time delay should be changed to achieve better performance. For optical sources that are part of a group of optical sources, the time delay may be changed in one of the optical sources and the performance may be monitored further by the monitoring system 350. If the performance is improved, the monitoring system 350 may issue a command signal to all of the optical sources in the group such that the time delay is changed on all of the optical sources of the group.

Determining a condition also may include determining that the performance of the optical source 505 and/or the optical system 501 is not optimal. The optical source 505 and/or the optical lithography system 501 may be deployed with a set of initial operating parameter values or default values that are set by the manufacturer when the optical lithography system 501 is commissioned. Because different operators and end users have different goals for the output and use of the optical lithography system 501, the default operating parameters may not be optimal for a particular situation or a particular manner in which the end user or operator of the lithography system 501 wishes to use the system 501. The monitoring system 350 may monitor the performance of the system 501 and/or the source 505 in the end user's situation and change one or more operating parameters to optimize performance.

Additionally, the operating parameters of the optical source 505 may change from an action taken outside of the monitoring system. For example, a software update to the control system 507A may result in a change in some of the default operating parameters, which may impact performance of the optical source 505 and/or the optical lithography system 501. The monitoring system 350 is able to monitor the optical lithography system 501 and/or the optical source 505 and take corrective action to address performance issues that may arise.

In the example of FIG. 4, a single monitoring system 350 is shown in communication with all of the optical lithography systems 401_1 to 401_n in the group 403. However, other configurations are possible. For example, each optical lithography system 401_1 to 401_n may be connected to a separate monitoring system.

What is claimed is:

1. A system comprising:
an optical lithography system, the optical lithography system comprising:
an optical source configured to produce an optical beam, the optical source comprising one or more control systems, each of the one or more control systems being configured to adjust an operating parameter of the optical source; and
a lithography apparatus comprising:
a projection optical system configured to receive the optical beam from the optical source and to produce an exposure beam; and
a wafer region configured to receive a wafer and the exposure beam; and
a monitoring system coupled to the optical lithography system, the monitoring system configured to:
access at least one rule that associates an execution criteria related to conditions of the optical source and/or the lithography apparatus with one or more modules in a library of modules,
identify a module from the library of modules based on the accessed rule,
determine whether a particular condition exists in the optical lithography system using the identified module and information from the optical lithography system; and
if the particular condition exists, provide a command signal to the optical lithography system, the command signal being based on the determined particular condition and being sufficient to cause one or more of the control systems to adjust one or more operating parameters of the optical source, wherein
each of the one or more operating parameters of the optical source specifies a behavior of the optical source, and adjusting one or more operating parameters of the optical source changes one or more behaviors of the optical source.

2. The system of claim 1, wherein
the optical source further comprises a data interface,
the monitoring system is coupled to the data interface of the optical source,
the information from the optical lithography system is received from the data interface of the optical source, and
the command signal is provided to the optical lithography system through the data interface of the optical source.

3. The system of claim 1, wherein
the optical source further comprises a data interface,
the lithography apparatus further comprises a data interface,
the monitoring system is coupled to the data interface of the optical source and to the data interface of the lithography apparatus,
the information from the optical lithography system comes from either or both of: the optical source and the lithography apparatus, and
the command signal is provided to the optical lithography system through the data interface of the optical source.

4. The system of claim 1, wherein
the optical beam produced by the optical source is a pulsed optical beam,
the pulsed optical beam has a repetition rate, the repetition rate indicating a time between a particular pulse of the pulsed optical beam and a pulse immediately adjacent to the particular pulse,
the one or more control systems of the optical source are configured to operate at a control rate, the control rate being equal to or greater than the repetition rate such that the control systems are capable of adjusting the one or more operating parameters of the optical source for each pulse in the pulsed optical beam, and
the monitoring system has a monitoring system rate, the monitoring system rate indicating a minimum amount of time between two separate instances of the command signal being provided to the optical lithography system, and
the minimum amount of time between two separate instances of the command signal being provided to the optical lithography system is greater than the time between pulses of the pulsed optical beam such that the monitoring system rate is slower than the control rate and the repetition rate.

5. The system of claim 4, wherein the monitoring system is further configured to:
store information received from the optical lithography system over a first time period, the first time period being greater than the time between two adjacent pulses in the pulsed optical beam;
analyze the stored information received from the optical lithography system over the first time period; and
wherein the monitoring system is configured to determine whether the particular condition exists using the identified module and the analyzed stored information.

6. The system of claim 5, wherein the monitoring system is further configured to poll the optical lithography system to receive the information from the optical lithography system.

7. The system of claim 1, wherein the monitoring system is coupled to one or more other optical lithography systems, and the monitoring system is configured to: receive information from any coupled optical lithography system, and provide command signals to any coupled optical lithography system.

8. The system of claim 7, wherein the monitoring system determines that the particular condition exists in at least one of the other optical lithography systems based on the received information, the monitoring system identifies in which of the optical lithography systems the condition exists, and the monitoring system provides the command signal only to the identified lithography systems.

9. The system of claim 7, wherein the monitoring system determines that the particular condition exists in at least one of the other optical lithography systems based on the received information, the monitoring system identifies in which of the optical lithography systems the condition exists, and the monitoring system provides the command signal to all of the optical lithography systems.

10. The system of claim 1, wherein the operating parameters of the optical source have default values, and the command signal causes at least one of the one or more control systems to adjust at least one operating parameter to a value that is different than the default value of that operating parameter.

11. The system of claim 1, wherein the at least one rule comprises a collection of rules, the execution criteria comprises time-related execution criteria and event-related execution criteria such that the collection of rules comprises event-based rules and time-based rules, the event-based rules being rules that are associated with an event in the optical source and that specify one or more modules in the library of modules based on an occurrence of the event in the optical source, and the time-based rules being rules that are associated with an amount of time and that specify one or more modules in the library of modules based on the passage of the amount of time.

12. The system of claim 11, wherein the monitoring system is further configured to:
determine whether an event has occurred within the optical source,
determine whether an amount of time has passed, and
access one of the rules of the collection of rules based on either or both of: the determination of whether an event has occurred within the optical source and the determination of whether an amount of time has passed.

13. The system of claim 1, wherein the command signal is provided to the optical lithography system while the optical source produces the optical beam, and the one or more operating parameters are adjusted while the optical source produces the optical beam.

14. A method of monitoring an optical lithography system, the method comprising:
receiving information from the optical lithography system during a first time period;
accessing a rule, the rule being associated with either or both of: an event in the optical lithography system and an amount of time passing;
identifying a module stored in a library of modules based on the accessed rule;
determining whether a particular condition exists in the optical lithography system using the identified module and the information received from the optical lithography system during the first time period; and
if the particular condition exists, generating a command signal based on one or more characteristics of the particular condition and providing the command signal to an optical source of the optical lithography system, wherein: the command signal is based on the determined particular condition, the command signal is sufficient to change one or more operating parameters of the optical source, and the command signal is provided to the optical source after the first time period.

15. The method of claim 14, further comprising storing the information received during the first time period, and wherein determining whether a particular condition exists in the optical lithography system comprises analyzing the stored information after the first time period.

16. The method of claim 15, further comprising, prior to accessing the rule, determining a rule to access based on the received information from the optical lithography system.

17. The method of claim 14, wherein determining whether a particular condition exists comprises:
comparing the information received from the optical lithography system during the first time period to stored information,
determining whether a threshold is met or exceeded based on the comparison, and
declaring that the particular condition exists when the threshold is met or exceeded.

18. The method of claim 14, wherein determining whether a particular condition exists comprises:
analyzing the information received from the optical lithography system during the first time period,
determining a value of one or more operating parameters of the optical source based on the analyzed information,
comparing the determined values to an expected value for each of the one or more operating parameters, and
declaring that the particular condition exists when the determined values are outside of a pre-defined range of values relative to the expected value.

19. The method of claim 14, further comprising presenting an indication of an adjustment to one or more operating parameters of the optical source, the adjustment being caused by the command signal, and the indication being perceivable to an operator of the optical lithography system.

20. A monitoring system comprising:
a monitoring data interface configured to send information to and receive information from one or more optical lithography systems, each of the optical lithography systems comprising an optical source;
an electronic storage; and one or more electronic processors coupled to the electronic storage, the electronic storage comprising instructions that, when executed, cause the one or more processors to:
- access at least one rule, the rule associating one or more of an event in any of the one or more optical lithography systems and a temporal period with a module configured to analyze information from any of the one or more optical lithography systems and produce a command signal;
- identify a module in a library of modules stored at the electronic storage based on the accessed at least one rule;
- determine whether a particular condition exists in any of the one or more of the optical lithography systems using the identified module and information from the optical lithography system; and
- if the particular condition exists in any of the one or more optical lithography systems, generate a command signal, the command signal being based on the determined particular condition and being sufficient to change one or more operating parameters of an optical source of any of the one or more of the optical lithography systems, and provide the command signal to at least one optical source.

21. The monitoring system of claim 20, wherein the command signal is provided to the at least one optical source while the at least one optical source produces a pulsed optical beam.

22. The monitoring system of claim 20, wherein the at least one rule and one or more of the modules in the library of modules are configured to be edited by an operator of the monitoring system.

23. The monitoring system of claim 20, wherein at least one rule comprise one or more of event-based rules and time-based rules, the event-based rules being associated with an occurrence of an event in the optical lithography system, and the time-based rules being associated with a passage of an amount of time.

24. The system of claim 1, wherein
the monitoring system being configured to determine whether a particular condition exists comprises the monitoring system being configured to determine whether a dropout condition exists in the optical lithography system, the dropout condition being a condition in which an optical energy of the optical beam produced by the optical source is less than an expected optical energy, and
if a dropout condition is determined to exist, the command signal is sufficient to change a speed of a fan configured to circulate gas in a chamber of the optical source, a temperature of a gas in a chamber of the optical source, and/or an amount of a gas in a chamber of the optical source.

25. The method of claim 14, wherein
the information received during the first time period comprises information related to an optical energy of an optical beam produced by the optical source, and
determining whether a particular condition exists in the optical lithography system using the identified module comprises determining whether a dropout condition exists in the optical lithography system, the dropout condition being a condition in which the optical energy of the optical beam produced by the optical source is less than an expected optical energy.

26. The method of claim 25, wherein, if a dropout condition exists, the command signal is sufficient to change a fan in the optical source, the fan being configured to circulate a gas in a chamber of the optical source.

27. The method of claim 26, wherein, if a dropout condition exists, the command signal is sufficient to change a temperature of the gas in the chamber or a pressure of the gas in the chamber.

28. The method of claim 26, wherein, if a dropout condition exists, and the command signal is sufficient to decrease an amount of the gas in the chamber of the optical source.

29. The monitoring system of claim 20, wherein
the monitoring data interface is configured to send information to and receive information from more than one optical lithography system,
the instructions to determine whether a particular condition exists in any of the optical lithography systems using the identified module and information from the lithography systems comprises instructions to determine whether a dropout condition exists in any of the optical lithography systems, and
if a dropout condition exists in any of the optical lithography systems, a command signal based on the determination of the existence of the dropout condition is generated, the command signal being sufficient to change a speed of a fan in at the optical source of at least one of the optical lithography systems, the fan being configured to circulate a gaseous gain medium in a chamber of the optical source.

30. The monitoring system of claim 29, wherein the command signal is sufficient to change an amount of the gas in the chamber of the optical source.

* * * * *